US011013126B2

(12) United States Patent
Araki

(10) Patent No.: US 11,013,126 B2
(45) Date of Patent: May 18, 2021

(54) CONNECTION STRUCTURE

(71) Applicant: DEXERIALS CORPORATION, Tokyo (JP)

(72) Inventor: Yuta Araki, Tochigi (JP)

(73) Assignee: DEXERIALS CORPORATION, Tokyo (JP)

(*) Notice: Subject to any disclaimer, the term of this patent is extended or adjusted under 35 U.S.C. 154(b) by 0 days.

(21) Appl. No.: 16/465,184

(22) PCT Filed: Nov. 22, 2017

(86) PCT No.: PCT/JP2017/041948
§ 371 (c)(1),
(2) Date: May 30, 2019

(87) PCT Pub. No.: WO2018/101138
PCT Pub. Date: Jun. 7, 2008

(65) Prior Publication Data
US 2020/0008304 A1 Jan. 2, 2020

(30) Foreign Application Priority Data
Dec. 1, 2016 (JP) .............................. JP2016-233714

(51) Int. Cl.
*H01L 23/00* (2006.01)
*H01L 23/29* (2006.01)
(Continued)

(52) U.S. Cl.
CPC ............ *H05K 3/323* (2013.01); *C08L 101/00* (2013.01); *C09J 7/20* (2018.01); *C09J 9/02* (2013.01);
(Continued)

(58) Field of Classification Search
CPC ........... H01L 24/29; H01L 2224/29499; H01L 24/83; H01L 2224/49173
See application file for complete search history.

(56) References Cited

U.S. PATENT DOCUMENTS 4,209,481 A 6/1980 Kashiro et al.
5,851,644 A * 12/1998 McArdle ................. H01F 41/16
428/213

(Continued)

FOREIGN PATENT DOCUMENTS

JP S53-033390 A 3/1978
JP H07-302668 A 11/1995
(Continued)

OTHER PUBLICATIONS

Feb. 20, 2018 International Search Report issued in International Patent Application No. PCT/JP2017/041948.
(Continued)

*Primary Examiner* — Eva Y Montalvo
*Assistant Examiner* — David J Goodwin
(74) *Attorney, Agent, or Firm* — Oliff PLC

(57) ABSTRACT

A connection structure: a first electronic component having a terminal pattern in which a plurality of terminals are arranged side by side in a radial form and a second electronic component having a terminal pattern corresponding to the terminal pattern of the first electronic component are anisotropically conductively connected using an anisotropic conductive film, (i) the effective connection area per terminal is 3000 $\mu m^2$ or more, and the number density of conductive particles in the anisotropic conductive film is 2000 particles/$mm^2$ or more and 20000 particles/$mm^2$ or less, (ii) as the anisotropic conductive film, adopted is an anisotropic conductive film in which the conductive particles are arranged in a lattice form, and the arrangement pitch and the arrangement direction are configured such that each terminal cap-
(Continued)

tures three or more conductive particles, or (iii) as the anisotropic conductive film, adopted is an anisotropic conductive film having a multiple circular region.

16 Claims, 15 Drawing Sheets

(51) Int. Cl.
| | | |
|---|---|---|
| *C09J 9/02* | (2006.01) | |
| *H05K 3/32* | (2006.01) | |
| *C09J 7/20* | (2018.01) | |
| *C08L 101/00* | (2006.01) | |
| *H01B 5/16* | (2006.01) | |
| *H01R 11/01* | (2006.01) | |
| *H01R 43/20* | (2006.01) | |

(52) U.S. Cl.
CPC .............. *H01B 5/16* (2013.01); *H01R 11/01* (2013.01); *H01R 43/20* (2013.01); *C08K 2201/005* (2013.01); *C09J 2301/208* (2020.08); *C09J 2301/314* (2020.08); *C09J 2301/408* (2020.08)

(56) References Cited

U.S. PATENT DOCUMENTS

| | | | |
|---|---|---|---|
| 5,951,304 A | 9/1999 | Wildes et al. | |
| 6,042,894 A | 3/2000 | Goto et al. | |
| 6,198,522 B1* | 3/2001 | Yanagi | G02F 1/13452 349/139 |
| 10,242,605 B2* | 3/2019 | Chen | H01L 23/528 |
| 10,553,554 B2* | 2/2020 | Akutsu | C09J 9/02 |
| 2005/0276918 A1* | 12/2005 | Tam | H05K 3/323 427/180 |
| 2007/0275578 A1* | 11/2007 | Yamada | H05K 1/0269 439/79 |
| 2014/0291869 A1* | 10/2014 | Park | H01L 24/27 257/783 |
| 2015/0226995 A1* | 8/2015 | Aota | H01L 23/49816 349/149 |
| 2015/0240130 A1* | 8/2015 | Liang | C09J 9/02 428/206 |
| 2016/0270225 A1 | 9/2016 | Shinohara | |
| 2018/0022968 A1 | 1/2018 | Yoshizawa et al. | |

FOREIGN PATENT DOCUMENTS

| | | |
|---|---|---|
| JP | H09-320345 A | 12/1997 |
| JP | H11-112119 A | 4/1999 |
| JP | 2007-019550 A | 1/2007 |
| JP | 2011-231136 A | 11/2011 |
| JP | 2015-232660 A | 12/2015 |
| JP | 2016-066573 A | 4/2016 |
| TW | 570203 U | 1/2004 |
| WO | 2016/152791 A1 | 9/2016 |

OTHER PUBLICATIONS

Nov. 13, 2018 Written Opinion of the International Preliminary Examining Authority issued in International Patent Application No. PCT/JP2017/041948.
Feb. 14, 2019 International Preliminary Report on Patentability issued in International Patent Application No. PCT/JP2017/041948.
Feb. 20, 2018 Written Opinion of the International Searching Authority issued in International Patent Application No. PCT/JP2017/041948.
Mar. 18, 2020 Korean Office Action issued in Korean Patent Application No. 10-2019-7014932.
Jan. 29, 2021 Office Action issued in Chinese Patent Application No. 201780071467.7.
Jan. 25, 2021 Office Action issued in Taiwanese Patent Application No. 106141631.

\* cited by examiner

CONNECTION STRUCTURE

TECHNICAL FIELD

The present invention relates to a connection structure using an anisotropic conductive film.

BACKGROUND ART

In electronic components such as IC chips, terminal pitches are becoming finer. With reduction in weight of the electronic components, FPCs (flexible printed circuits) and plastic substrates having relatively low specific gravities are often used. To mount the electronic components, an anisotropic conductive film, in which conductive particles are dispersed in an insulating resin layer, is widely used.

However, the use of the FPCs and the plastic substrates brings about a problem that the layout of terminals minutely varies even among the same electronic components before anisotropic conductive connection due to the effect of environmental temperature on thermal expansion. In the case of continuously performing the anisotropic conductive connection in mass production of products in which the electronic components are mounted, if pressure bonding temperature varies in individual connection, there is also a problem that the positions of the terminals tend to deviate from their predetermined positions due to the effect of the pressure bonding temperature on thermal expansion. Among the electronic components of different production lots, the substrates and the like on which the terminals are provided are sometimes made of materials having different coefficients of linear expansion, so the same problem occurs. As described above, the problems relating to the thermal expansion of the electronic components exist before and after a connection process.

Against this, it is proposed that, in a terminal pattern in which a plurality of terminals are arranged side by side, the individual terminals are arranged along radial lines that pass through one point outside the terminal pattern (Patent Literatures 1, 2 and 3).

On the other hand, it is proposed that, when terminal patterns in which a plurality of terminals are arranged in parallel are anisotropically conductively connected, conductive particles of an anisotropic conductive film are arranged in a lattice form in predetermined arrangement directions with a predetermined inter-particle distance such that each terminal captures a sufficient number of the conductive particles even if the terminals are arranged with a fine pitch (Patent Literature 4).

CITATION LIST

Patent Literature

Patent Literature 1: Japanese Patent Application Laid-Open No. Hei. 11-112119
Patent Literature 2: Japanese Patent Application Laid-Open No. 2007-19550
Patent Literature 3: Japanese Patent Application Laid-Open No. 2015-232660
Patent Literature 4: Japanese Patent Application Laid-Open No. 2016-66573

SUMMARY OF INVENTION

Technical Problem

However, if terminal patterns of first and second electronic components have a plurality of terminals arranged side by side in a radial form, as described in Patent Literatures 1, 2 and 3, and the terminal patterns are connected to each other using an anisotropic conductive film, some terminals cannot sufficiently capture conductive particles due to inclination of each terminal. Since a capturing state is significantly different from terminal to terminal, it requires much time to determine the quality of connection and the like, thus causing a problem with productivity.

For example, as shown in FIG. 9, when a terminal pattern 21A of a first electronic component 30A has a terminal pattern in which a plurality of terminals 20A are arranged side by side in a radial form (in other words, a terminal pattern in which the individual terminals 20A extend along radial lines R centering on a point P outside the terminal pattern 21A), and a second electronic component 30B has a terminal pattern that coincides with the terminal pattern 21A of the first electronic component, and the first and second electronic components are connected by an anisotropic conductive film 10x in which conductive particles 1 are arranged in a square lattice form in an insulating resin layer 2, terminals 20a and 20b that capture no conductive particles 1 are present in effective connection regions of the terminal pattern 21A and the terminal pattern 21B. In the drawing, such terminals 20a and 20b are diagonally hatched. Conductive particles 1 that are captured between the opposed terminals of the first electronic component 30A and the second electronic component 30B are shaded. Note that, in the drawing, when an overlap portion between a conductive particle and a terminal is ½ or less the area of the conductive particle, the conductive particle is determined to not be captured, and hence is not shaded.

As shown in FIG. 10, in a similar case, when conductive particles 1 of an anisotropic conductive film 10y are arranged in a hexagonal lattice arrangement, a terminal 20c that captures no conductive particles 1 is present among the terminals constituting the terminal pattern 21A.

To cope with such problems, an object of the present invention is to reduce or eliminate terminals that capture no conductive particles in a connection structure that is obtained by anisotropically conductively connecting, using an anisotropic conductive film, a first electronic component having a terminal pattern in which a plurality of terminals are arranged side by side in a radial form and a second electronic component having a terminal pattern corresponding to the terminal pattern of the first electronic component.

Solution to Problem

The present inventor has found that, when electronic components having terminal patterns in which a plurality of terminals are arranged side by side in a radial form are anisotropically conductively connected to each other, it is possible to reduce or eliminate the terminals that capture no conductive particles in a connection structure, by varying the number density of the conductive particles of an anisotropic conductive film in accordance with effective connection areas and pitches of the terminals and preferably by defining an arrangement state of the conductive particles, and has thereby arrived at the present invention.

Namely, a first aspect of the present invention is a method for producing a connection structure in which a first electronic component having a terminal pattern in which a plurality of terminals are arranged side by side in a radial form and a second electronic component having a terminal pattern corresponding to the terminal pattern of the first electronic component are anisotropically conductively connected using an anisotropic conductive film, wherein an effective connection area per terminal is 3000 µm² or more, and the number density of conductive particles in the anisotropic conductive film is 2000 particles/mm² or more and 20000 particles/mm² or less.

A second aspect of the present invention is a method for producing a connection structure in which a first electronic component having a terminal pattern in which a plurality of terminals are arranged side by side in a radial form and a second electronic component having a terminal pattern corresponding to the terminal pattern of the first electronic component are anisotropically conductively connected using an anisotropic conductive film, wherein the anisotropic conductive film is an anisotropic conductive film in which conductive particles are arranged in a lattice form in an insulating resin layer in a plan view, and the lattice form arrangement has such an arrangement pitch and an arrangement direction that each terminal captures three or more conductive particles in effective connection regions of the first electronic component and second electronic component.

A third aspect of the present invention is a method for producing a connection structure in which a first electronic component having a terminal pattern in which a plurality of terminals are arranged side by side in a radial form and a second electronic component having a terminal pattern corresponding to the terminal pattern of the first electronic component are anisotropically conductively connected using an anisotropic conductive film, wherein the anisotropic conductive film has a multiple circular region in which conductive particles are disposed at predetermined intervals on a plurality of concentric circles (including concentric ellipses) in an insulating resin layer in a plan view, and when a first line is defined as a line connecting between a first conductive particle on a first concentric circle and a center of the circles, and a second line is defined as a line connecting between a second conductive particle, which is the nearest to the first conductive particle, on a second concentric circle adjacent to the first concentric circle and the center of the circles, the conductive particles are disposed such that the first line and the second line do not coincide with each other.

The present invention provides an anisotropic conductive film in which conductive particles are arranged in a lattice form, as an anisotropic conductive film used in the second method for producing a connection structure, the anisotropic conductive film being used for anisotropically conductively connecting a first electronic component having a terminal pattern in which a plurality of terminals are arranged side by side in a radial form and a second electronic component having a terminal pattern corresponding to the terminal pattern of the first electronic component, wherein when, in the anisotropic conductive film, γ represents an angle formed between an arrangement axis having the smallest arrangement pitch or the second smallest arrangement pitch of the conductive particles and a short-side direction of the anisotropic conductive film, and $\alpha_{max}$ represents a maximum value of an angle formed between a center axis extending in a long-side direction of each terminal constituting the terminal pattern and the short-side direction of the terminal pattern, the anisotropic conductive film has an arrangement axis satisfying $\gamma > \alpha_{max}$.

The present invention also provides an anisotropic conductive film in which conductive particles are disposed in an insulating resin layer, as an anisotropic conductive film used in the third method for producing a connection structure, wherein the anisotropic conductive film has a multiple circular region in which the conductive particles are disposed on a plurality of concentric circles in the insulating resin layer in a plan view, and when a first line is defined as a line connecting between a first conductive particle on a first concentric circle and a center of the circles, and a second line is defined as a line connecting between a second conductive particle, which is the nearest to the first conductive particle, on a second concentric circle adjacent to the first concentric circle and the center of the circles, the conductive particles are disposed such that the first line and the second line do not coincide with each other.

Furthermore, the present invention provides a connection structure produced by the above-described method for producing the connection structure.

Advantageous Effects of Invention

According to the present invention, when the connection structure is obtained by connecting the electronic components having the terminal patterns, in each of which a plurality of the terminals are arranged side by side in a radial form, to each other, it is possible to reduce or eliminate the terminals that capture no conductive particles.

In particular, according to the first method for producing the connection structure, when a terminal area is relatively large, and the effective connection area per terminal is 3000 µm² or more, it is possible to reduce or eliminate the terminals that capture no conductive particles in the connection structure, even if the conductive particles are disposed in a regular manner or at random in the anisotropic conductive film.

According to the second method for producing the connection structure, when the conductive particles are regularly arranged in a lattice form in the anisotropic conductive film, it is possible to reduce or eliminate the terminals that capture no conductive particles in the connection structure. It is also possible to equalize the captured state of the conductive particles by each individual terminal constituting the terminal pattern. In particular, when the terminal pattern is symmetrical, a significant effect can be obtained.

According to the third method for producing the connection structure, irrespective of the size or pitch of the terminals of the electronic component, it is possible to reduce or eliminate the terminals that capture no conductive particles in the connection structure. It is also possible to equalize the captured state of the conductive particles by each individual terminal constituting the terminal pattern. In particular, when the terminal pattern is symmetrical, a significant effect can be obtained.

DESCRIPTION OF EMBODIMENTS

Figure 1A:
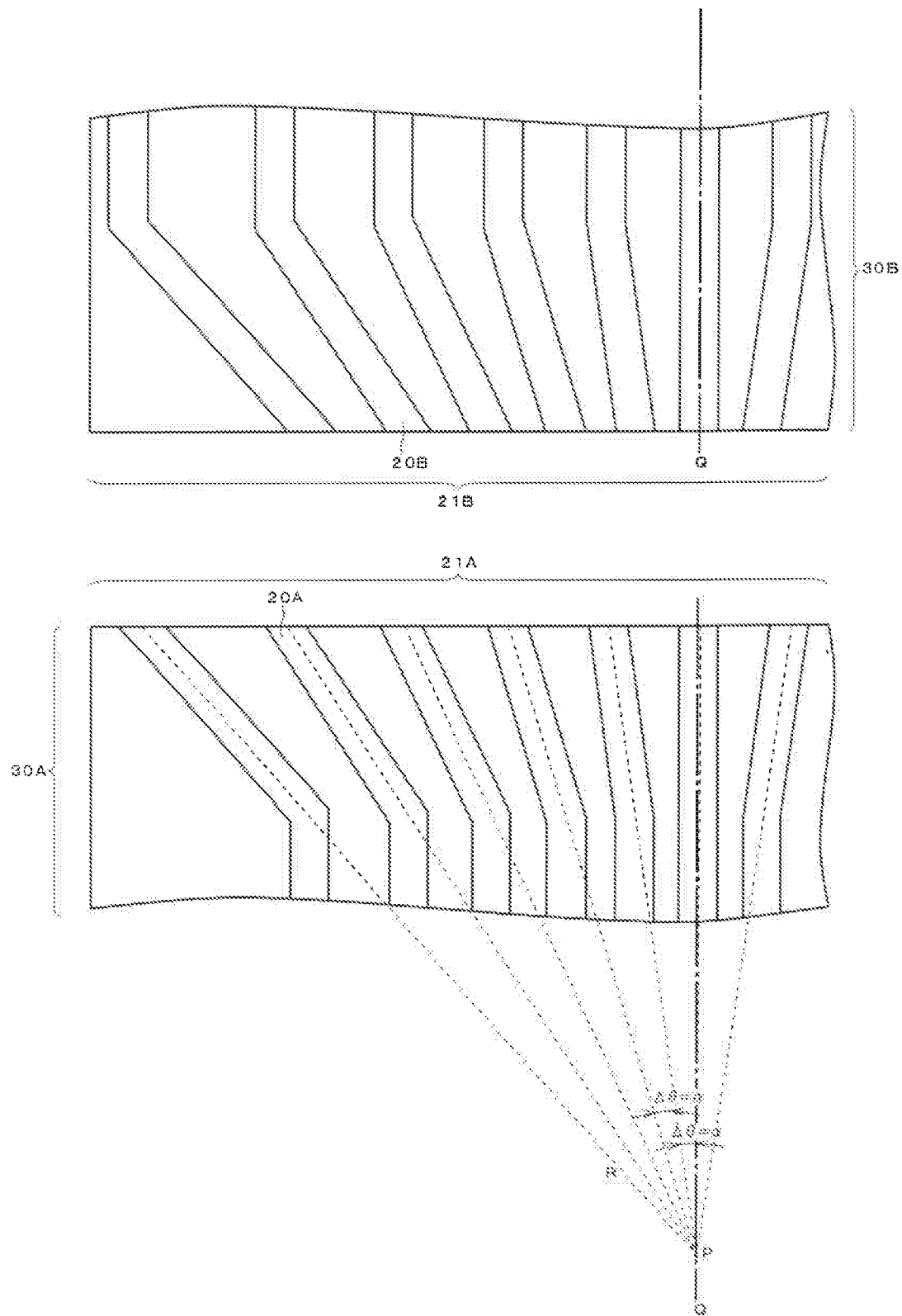
FIG. 1A is a plan view of terminal patterns of electronic components used in a production method of a connection structure according to a first invention.

The present invention will be described below in detail with reference to the drawings. Note that the same reference numerals indicate the same or similar components as or to those in the respective drawings.
[First Invention]
(Overall Structure of Connection Structure)

Figure 1B:
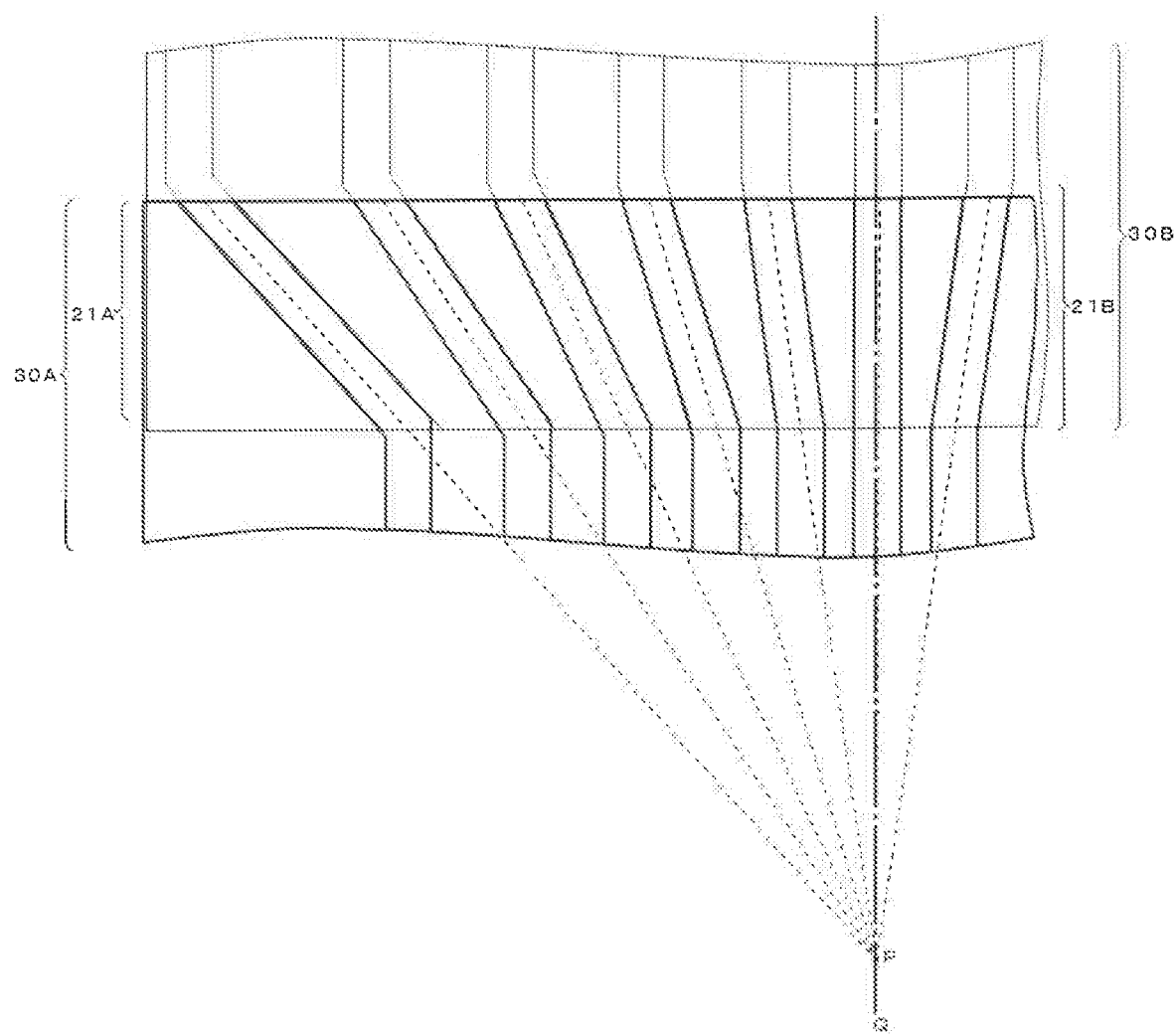
FIG. 1B is a plan view illustrating an overlap state of the terminal patterns of the electronic components used in the production method of the connection structure according to the first invention.

FIG. 1A is a plan view of a terminal pattern 21A of a first electronic component 30A and a terminal pattern 21B of a second electronic component 30B used in a production method of a connection structure according to a first invention, and FIG. 1B is a plan view illustrating a state of overlapping between the terminal patterns 21A and 21B thereof.

In the terminal pattern 21A, a plurality of terminals 20A are arranged side by side in a radial form. In other words, each terminal 20A is formed into a band shape by using a radial line R passing through a point P outside the terminal pattern 21A as a center axis. In the present embodiment, the point P is on a center line Q of the width of the terminal pattern 21A, and the difference $\Delta\theta$ between adjacent terminal patterns with an angle $\theta$ formed between the center line Q and the line R, i.e., the center axis of each terminal 20A extending in a long-side direction, is constant and satisfies $\Delta\theta=\alpha$. Note that, in the present invention, there is no limitation imposed on the angle $\theta$, and the angle $\theta$ may vary by a constant angle or in a regular manner. All of the lines R, each of which constitutes the center axis of each terminal 20A, do not necessarily pass through the point P. For example, in a terminal in which a small angle is formed between the line R and the center line Q, the line R may be in parallel with the center line Q. There may be a portion in which terminals inclined by the same angle may be arranged side by side. There may be a plurality of symmetrical points P. The terminal pattern 21A having the plurality of terminals 20A may not be symmetrical with respect to the center line Q.

Figure 1C:
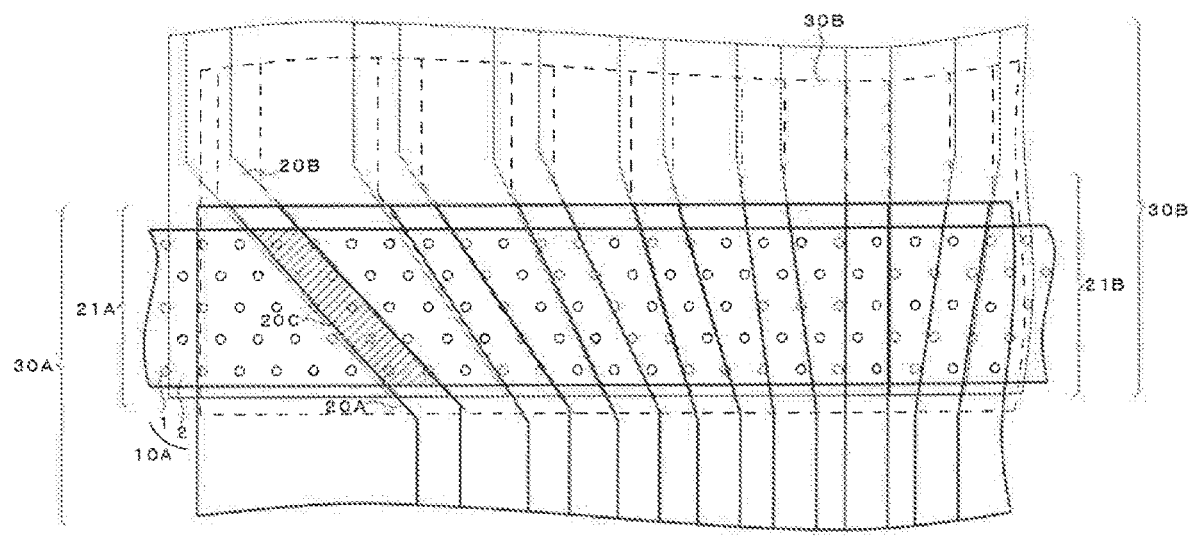
FIG. 1C is a plan view illustrating a state of overlapping between terminal patterns of a first electronic component and a thermally expanded second electronic component.

The terminal pattern 21B of the second electronic component 30B corresponds to the terminal pattern 21A of the first electronic component 30A, and as shown in FIG. 1B, the terminal patterns 21B and 21A are formed so as to overlap with each other at a predetermined temperature. Note that, in a case where each of the terminals 20A and 20B are formed radially in the terminal patterns 21A and 21B, if one of the first electronic component 30A and the second electronic component 30B relatively expands by heat or the like with respect to the other, as shown in FIG. 1C, each of the terminals 20A of the first electronic component 30A can overlap with each of the terminals 20B of the second electronic component 30B corresponding thereto. Note that, in FIG. 1C, the reference numeral 30B illustrated by solid lines indicates the second electronic component after the expansion, while the reference numeral 30B illustrated by broken lines indicates the second electronic component before the expansion. Note that the electronic components of the present invention may have the same or different wiring widths and terminal widths, and the same or difference wiring heights and terminal heights. As an example having different wiring heights and terminal heights, an IC chip or the like may be mentioned.

Note that, since an IC chip has an extremely lower effect of thermal expansion on an FPC, a plastic substrate or the like, a first electronic component constitutes the IC chip, and an expanding second electronic component constitutes the FPC or the plastic substrate in the connection structure illustrated in FIG. 1C.
(Effective Connection Area)

In the first invention, an effective connection area per terminal of the terminals 20A and 20B radially formed as described above is set to 3000 µm² or more. The effective connection area of the terminal refers to an area of an effective connection region in which the terminal 20A of the first electronic component 30A, the terminal 20B of the second electronic component 30B, and an anisotropic conductive film 10A actually overlap with one another. For example, as shown in FIG. 1C, when the terminal 20A of the first electronic component 30A and the terminal 20B of the second electronic component 30B partly overlap with each other, the effective connection area refers to an area of a region 20C in which the partly overlapping region overlaps with the anisotropic conductive film 10A. In FIG. 1C, one of the effective connection regions 20C is diagonally hatched. In the first invention, since the effective connection area per terminal is set to 3000 µm² or more, each of the terminals 20A and 20B preferably has an area of 3000 μm² or more, and therefore preferably has a width per terminal of 5 to 300 μm, and more preferably has a width per terminal of 20 to 200 μm. The terminal preferably has a length of 10 to 3000 μm, and more preferably has a length of 500 to 2000 μm. The space between the terminals is preferably set to 10 to 300 μm, and more preferably set to 20 to 200 μm. Note that, the terminal width and the space between the terminals may have an upper limit of the order of 1000 μm, as necessary.

(Anisotropic Conductive Film)

Number Density

In the anisotropic conductive film 10A, for example, as illustrated in FIG. 1C, an insulating resin layer 2 holds conductive particles 1. In the first invention, when the terminal area is relatively large and the effective connection area per terminal is 3000 μm² or more, as described above, the number density of the conductive particles 1 in the anisotropic conductive film 10A is 2000 particles/mm² or more and 20000 particles/mm² or less, and preferably 7000 particles/mm² or more and 15000 particles/mm² or less. The conductive particle capturing properties at each terminal of the connection structure can thereby be improved.

Note that the area occupancy rate calculated by the following equation from the number density of the conductive particles and the average area of one conductive particle in a plan view becomes an index of the thrust required for a pressing jig for thermocompression bonding the anisotropic conductive film to the electronic components.

Area occupancy rate (%)=[number density of conductive particles in a plan view (particles/mm²)]×[average area of one conductive particle in a plan view(mm²/particle)]×100

The area occupancy rate is preferably 35% or less, and more preferably within a range of 0.3 to 30%. This makes it possible to reduce the thrust required for the pressing jig for thermocompression bonding the anisotropic conductive film to the electronic components.

Particle Disposition

There is no specific limitation in disposition of the conductive particles 1 in the anisotropic conductive film 10A. The conductive particles 1 may be arranged at random, in a lattice form, or the like. Examples of the arrangement in a lattice form may include a square lattice, a hexagonal lattice, a rhombic lattice, and a rectangular lattice. An arrangement axis of the lattice form may be inclined with respect to the long-side direction of the film. As the particle disposition of the whole conductive particles, particle rows in which the conductive particles 1 are linearly arranged at predetermined intervals may be arranged in parallel side by side at predetermined intervals.

Conductive Particles

Examples of the conductive particles 1 may include metal particles made of nickel, cobalt, silver, copper, gold, palladium or the like, alloy particles made of solder, metal-coated resin particles, metal-coated resin particles to the surfaces of which insulating fine particles adhere. Two or more types of particles may be used in combination. Among these, the metal-coated resin particles are preferably used because of ease of maintenance of contact with the terminals, due to repulsion of the resin particles after the connection, thus stabilizing a conduction performance. The insulating fine particles may adhere to the surfaces of the conductive particles using a well-known technology, or an insulating treatment that does not interfere with the conduction performance may be applied thereto.

The particle diameter of the conductive particles 1 in the anisotropic conductive film 10A is preferably 1 μm or more and 30 μm or less, and more preferably 3 μm or more and less than 10 μm, in order to suppress an increase in conductive resistance and to suppress occurrence of a short circuit. The particle diameter of the conductive particles before being dispersed in the insulating resin layer can be measured by a general particle size distribution measuring apparatus, and the average particle diameter can also be measured by the particle size distribution measurement apparatus. Examples of the measurement apparatus may include FPIA-3000 (Malvern Panalytical Ltd.). The particle diameter of the conductive particles in the anisotropic conductive film can be obtained from observation with an electron microscope such as SEM. In this case, the number of samples for measuring the conductive particles diameter is desirably 200 or more, and preferably 1000 or more.

Note that, when a conductive particle having insulating fine particles attached to its surface is used as the conductive particle, the particle diameter of the conductive particle in the present invention means the particle diameter not including such insulating fine particles on the surface.

Proportion by Number of Conductive Particles Present in a Non-Contact State

The conductive particles 1 are preferably present in the anisotropic conductive film 10A without being in contact with each other in a plan view of the film, and without overlapping with each other in a film thickness direction. Thus, the proportion by the number of the conductive particles 1 that are present in a non-contact state with each other relative to all of the conductive particles is 95% or more, preferably 98% or more, and more preferably 99.5% or more. The same applies to the regular disposition and the random disposition. As described later, the conductive particles 1 are preferably disposed in a regular manner using a transfer mold, because the proportion at which the conductive particles 1 are present without being in contact with each other can be easily controlled. In the case of the random disposition, since the anisotropic conductive film can be easily produced by mixing the conductive particles 1 into an insulating resin, either a production method using the transfer mold or a production method using mixing and kneading can be selected by a tradeoff between performance and cost. Note that, a method for regularly disposing the conductive particles is not limited to the method using a transfer mold.

Positions of Conductive Particles in Film Thickness Direction

Figure 2:
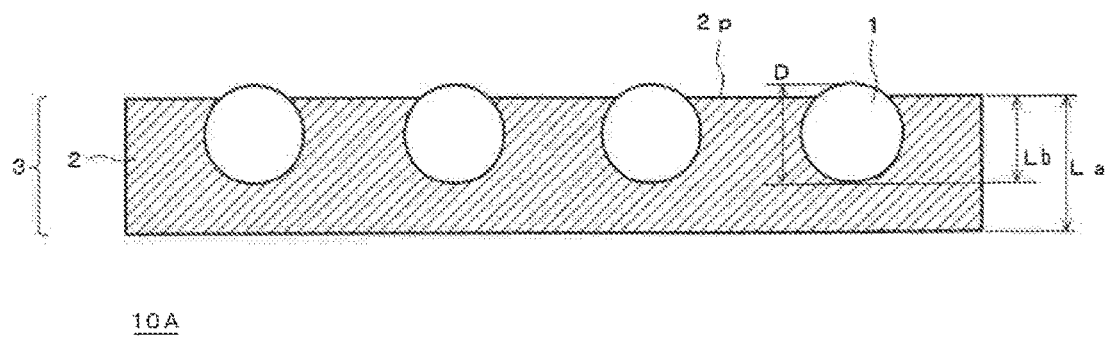
FIG. 2 is a cross sectional view of an anisotropic conductive film in a film thickness direction.

When the conductive particles 1 are present without being in contact with each other, the positions of the conductive particles 1 in the film thickness direction are preferably aligned. For example, as illustrated in FIG. 2, embedded amounts Lb of the conductive particles 1 in the film thickness direction can be made uniform. This facilitates stabilizing the conductive particle capturing properties at the terminal. Note that, in the present invention, the conductive particles 1 may be exposed from the insulating resin layer 2, or completely embedded therein.

Here, the embedded amount Lb refers to a distance between the surface of the insulating resin layer 2 in which the conductive particles 1 are embedded (of the front and back surfaces of the insulating resin layer 2, the surface on the side where the conductive particles 1 are exposed, or the surface close to the conductive particles 1 when the conductive particles 1 are completely embedded in the insulating resin layer 2), in particular, the tangential plane $2p$ in the center portion between the neighboring conductive particles, and the deepest portion of the conductive particles 1.

Embedded Rate

When an embedded rate (Lb/D) refers to the ratio of the embedded amount Lb relative to the average particle diameter D of the conductive particles 1, the embedded rate is preferably 30% or more and 105% or less. When the embedded rate (Lb/D) is 30% or more, the insulating resin layer 2 can maintain the conductive particles 1 in predetermined positions. When the embedded rate (Lb/D) is 105% or less, it is possible to reduce the amount of resin of the insulating resin layer, which acts to cause the conductive particles between the terminals to unnecessarily flow at the time of anisotropic conductive connection. When the conductive particles are exposed from the insulating resin layer 2 at an embedded rate of 100% or more, a pressure applied at the time of connection is easily transmitted to the conductive particles 1. When the conductive particles 1 are exposed from the insulating resin layer 2, the resistance of the insulating resin layer 2 against deformation of the conductive particles 1, which occurs by pushes of the conductive particles 1 by a pressing jig at the time of anisotropic conductive connection, is reduced, and thus, an impression state after the connection tends to be uniform. Therefore, a state after the connection is easily checked. When the conductive particles 1 are excessively exposed from the insulating resin layer 2, a second insulating resin layer, which is described later, may be provided.

Note that, in the present invention, the numerical value of the embedded rate (Lb/D) means that 99% or more, preferably 99.9% or more, and more preferably 99.99% or more of total number of conductive particles contained in the anisotropic conductive film have the embedded rate (Lb/D) of that numerical value. Therefore, the embedded rate of 30% or more and 105% or less means that the embedded rate of 99% or more, preferably 99.9% or more, and more preferably 99.99% or more of the total number of conductive particles contained in the anisotropic conductive film is 30% or more and 105% or less. Since all the conductive particles have the uniform embedded rate (Lb/D), a load is uniformly applied to the conductive particles, so that the terminals can capture the conductive particles in a better capturing state and conduction stability is improved.

(Insulating Resin Layer)

Viscosity of Insulating Resin Layer

In the anisotropic conductive film 10A, the minimum melt viscosity of the insulating resin layer 2 is set to about 1000 Pa·s, and may be 1100 Pa·s or more, preferably 2000 Pa·s or more, more preferably 3000 to 15000 Pa·s, and further preferably 3000 to 10000 Pa·s. The minimum melt viscosity can be determined by using, for example, a rotary rheometer (manufactured by TA Instruments), and maintaining a constant measurement pressure of 5 g with the use of a measurement plate of a diameter of 8 mm. More specifically, it can be determined by setting the rate of temperature increase to 10° C./min, the measurement frequency to 10 Hz, and the load variation to 5 g with respect to the measurement plate in a temperature range of 30 to 200° C.

When the minimum melt viscosity of the insulating resin layer 2 is at a high level of 2000 Pa·s or more, it is possible to prevent the conductive particles 1, to be held between the terminals, from flowing due to a resin flow at the time of anisotropic conductive connection.

Composition of Insulating Resin Layer)

The insulating resin layer 2 can be formed of a curable resin composition, for example, a thermo-polymerizable composition containing a thermo-polymerizable compound and a thermal polymerization initiator. The thermo-polymerizable composition may contain a photopolymerization initiator as necessary.

When a thermal polymerization initiator and a photopolymerization initiator are used in combination, a thermo-polymerizable compound which also functions as a photopolymerizable compound may be used as the thermo-polymerizable compound, or a photopolymerizable compound may be contained separately from the thermo-polymerizable compound. A photopolymerizable compound is preferably contained separately from the thermo-polymerizable compound. For example, a cationic curing initiator is used as the thermal polymerization initiator, an epoxy compound is used as the thermo-polymerizable compound, a photoradical polymerization initiator is used as the photopolymerization initiator, and an acrylate compound is used as the photopolymerizable compound.

As the photopolymerization initiator, a plurality of types thereof which react with light having different wavelengths may be contained. As a result, it is possible to selectively use wavelengths used for photocuring of the resin constituting the insulating resin layer at the time of producing the anisotropic conductive film and for photocuring of the resin for bonding the electronic components to each other at the time of anisotropic conductive connection.

In the photocuring at the time of producing the anisotropic conductive film, all or part of the photopolymerizable compound contained in the insulating resin layer can be photocured. By this photocuring, the disposition of the conductive particles 1 in the insulating resin layer 2 is held or fixed, so that the suppression of short-circuiting and the improvement of the capturing properties are expected. In addition, the viscosity of the insulating resin layer in the production process of the anisotropic conductive film may be appropriately adjusted by this photocuring. In particular, the photocuring is preferably performed when the ratio (La/D) between the layer thickness La of the insulating resin layer 2 and the average particle diameter D of the conductive particles 1 is less than 0.6. This is because, even when the layer thickness of the insulating resin layer 2 is thin with respect to the average diameter of the conductive particles, the disposition of the conductive particles is more reliably held or fixed by the insulating resin layer 2, and the viscosity of the insulating resin layer 2 is adjusted to suppress a decrease in yield in connection between electronic components using the anisotropic conductive film.

The mixed amount of the photopolymerizable compound in the insulating resin layer is preferably 30% by mass or less, more preferably 10% by mass or less, and further preferably less than 2% by mass. This is because too much an amount of the photopolymerizable compound increases the thrust of pushing-in applied at the time of connection.

Examples of the thermo-polymerizable composition may include a thermal radical polymerizable acrylate-based composition containing a (meth)acrylate compound and a thermal radical polymerization initiator, and a thermal cationic polymerizable epoxy-based composition containing an epoxy compound and a thermal cationic polymerization initiator. Instead of the thermal cationic polymerizable epoxy-based composition containing the thermal cationic polymerization initiator, a thermal anionic polymerizable epoxy-based composition containing a thermal anionic polymerization initiator may be used. Furthermore, a plurality of types of polymerizable compounds may be used in combination as long as they do not cause any particular problem. Examples of the combination may include a combination of a cationic polymerizable compound and a radical polymerizable compound.

As the (meth)acrylate compound, a conventionally known thermo-polymerizable (meth)acrylate monomer can be used. For example, monofunctional (meth)acrylate-based monomers, bifunctional or polyfunctional (meth)acrylate-based monomers may be used.

Examples of the thermal radical polymerization initiator may include an organic peroxide, and an azo compound. In particular, an organic peroxide which does not generate nitrogen which causes bubbles may preferably be used.

The amount of the thermal radical polymerization initiator used is preferably 2 to 60 parts by mass, and more preferably 5 to 40 parts by mass, with respect to 100 parts by mass of the (meth)acrylate compound, since too small an amount of the thermal radical polymerization initiator leads to poor curing and too large an amount of the thermal radical polymerization initiator leads to a decrease in product life.

Examples of the epoxy compound may include a bisphenol A type epoxy resin, a bisphenol F type epoxy resin, a novolac type epoxy resin, modified epoxy resins of these, and an alicyclic epoxy resin. Two or more types of these resins may be used in combination. In addition to the epoxy compound, an oxetane compound may be used in combination.

As the thermal cationic polymerization initiator, any known thermal cationic polymerization initiator for epoxy compounds may be adopted, and examples thereof used may include an iodonium salt, a sulfonium salt, a phosphonium salt, and a ferrocene, which generate an acid by heat. In particular, an aromatic sulfonium salt which exhibits good latency with respect to temperature may preferably be used.

The amount of the thermal cationic polymerization initiator used is preferably 2 to 60 parts by mass, and more preferably 5 to 40 parts by mass, with respect to 100 parts by mass of the epoxy compound, since too small an amount of the thermal cationic polymerization initiator tends to cause poor curing, and too large an amount thereof tends to lower the product life.

The thermo-polymerizable composition preferably contains a film forming resin or a silane coupling agent. Examples of the film forming resin may include a phenoxy resin, an epoxy resin, an unsaturated polyester resin, a saturated polyester resin, a urethane resin, a butadiene resin, a polyimide resin, a polyamide resin, and a polyolefin resin, and two or more of these resins may be used in combination. Of these, a phenoxy resin may preferably be used from the viewpoints of film forming property, processability, and connection reliability. The weight-average molecular weight is preferably 10000 or more. Examples of the silane coupling agent may include an epoxy-based silane coupling agent, and an acrylic silane coupling agent. These silane coupling agents are primarily alkoxysilane derivatives.

In order to adjust the melt viscosity, the thermo-polymerizable composition may contain insulating fillers in addition to the conductive fine particles attached to the conductive particles described above.

Examples of the insulating fillers may include silica powder and alumina powder. The size of the insulating fillers is preferably a particle diameter of 20 to 1000 nm, and the mixed amount thereof is preferably 5 to 50 parts by mass with respect to 100 parts by mass of a polymerizable compound such as an epoxy compound.

The anisotropic conductive film of the present invention may contain a filling agent, a softener, an accelerator, an antiaging agent, a colorant (pigment, dye), an organic solvent, an ion catcher agent, or the like, in addition to the above-mentioned insulating fillers.

Layer Thickness of Insulating Resin Layer

In the anisotropic conductive film according to the preset invention, the layer thickness of the insulating resin layer 2 is not specifically limited because it depends on the particle diameters of the conductive particles 1, a connected object, and the heights of the terminals; however by way of example, when the average particle diameter D is less than 10 μm, the ratio (La/D) between the layer thickness La of the insulating resin layer 2 and the average particle diameter D of the conductive particles 1 is preferably 0.3 or more and 10 or less, and the ratio (La/D) is more preferably 0.4 or more from the viewpoint of maintenance of disposition of the conductive particles 1 in the insulating resin layer 2. From the viewpoints of suppression of an excessive resin flow at the time of anisotropic conductive connection and the realization of low-pressure mounting, the ratio (La/D) is preferably 3 or less, and more preferably 1 or less. From the viewpoints of ease of exposure of the conductive particles 1 from the insulating resin layer 2 and further ease of low-pressure mounting, the ratio (La/D) is preferably less than 1, more preferably less than 0.6, and further preferably 0.5 or less. Note that, when the ratio (La/D) is 3 or less, there may be cases where a second insulating resin layer having a lower melt viscosity than that in the insulating resin layer 2 is preferably provided.

On the other hand, when the average particle diameter D is 10 μm or more, the upper limit of the La/D is set to 3.5 or less, preferably 2.5 or less, and more preferably 2 or less, and the lower limit thereof is set to 0.8 or more, preferably 1 or more, and more preferably more than 1.3.

Furthermore, if the ratio (La/D) is excessively high due to an excessively thick layer thickness La of the insulating resin layer 2 irrespective of the size of the average particle diameter D, the conductive particles 1 are hard to press against the terminals at the time of anisotropic conductive connection, and the conductive particles are easily flowed by the resin flow. Therefore, the positions of the conductive particles tend to deviate, and the conductive particle capturing properties at the terminals are reduced. An increased thrust is required of the pressing jig to press the conductive particles against the terminals, thus interfering with low-pressure mounting. On the contrary, when the ratio is excessively low due to an excessively thin layer thickness La of the insulating resin layer 2, it becomes difficult for the insulating resin layer 2 to maintain the conductive particles 1 in a predetermined position.

The larger the difference in the minimum melt viscosity between the second insulating resin layer and the insulating resin layer 2 is, the more easily the space between two terminals connected through the anisotropic conductive film is filled with the second insulating resin layer, thus allowing expectation of improvement in adhesion properties between the electronic components. The larger the difference thereof is, the relatively smaller the movement amount of the insulating resin layer 2 relative to the second insulating resin layer becomes, so that the conductive particle capturing properties at the terminals tend to be improved.

When the anisotropic conductive film having the second insulating resin layer is used for connection, in order to prevent unintended movement of the conductive particles and improve the capturing properties, it is preferable to dispose the second insulating resin layer on the side of an electronic component, to which pressure is applied by a thermocompression bonding tool, of the insulating resin layer 2 (in other words, the insulating resin layer 2 is preferably situated on the side of an electronic component mounted on a stage). To obtain a stable connection state, it is preferable to dispose the second insulating resin layer on the side on which the conductive particles of the insulating resin layer 2 are provided, because sufficient resin to maintain the conductive particles is present (it is preferable because the amount of resin to maintain holding of the conductive particles becomes relatively large). From the viewpoint of the capturing properties, it is preferable, for the same reason as above, to dispose the second insulating resin layer on an opposite side of the conductive particles of the insulating resin layer 2, because the conductive particles are generally closer to the electronic component mounted on the stage. These are appropriately selectable in accordance with the terminals, materials, and a connection method of the electronic components.

The larger the difference in the minimum melt viscosity between the insulating resin layer 2 and the second insulating resin layer is, the relatively smaller the movement amount of the insulating resin layer 2 containing the conductive particles becomes relative to the movement amount of the second insulating resin layer at the time of anisotropic conductive connection, so that the conductive particle capturing properties at the terminals tend to be improved. When the second insulating resin layer is used while being bonded in advance to the electronic component provided in a tool, the second insulating resin layer may be used as a tack layer.

The ratio in the minimum melt viscosity of the insulating resin layer 2 to the second insulating resin layer is preferably 2 or more, more preferably 5 or more, and further preferably 8 or more, in practical use, though it depends on the ratio in layer thickness of the insulating resin layer 2 to the second insulating resin layer. On the other hand, if this ratio is too large, when a long-length anisotropic conductive film is formed into a wound body, there is a concern that the resin may run off or be blocked, and therefore, it is practically preferable that the ratio be 15 or less. To be more specific, the preferable minimum melt viscosity of the second insulating resin layer is 3000 Pa·s or less, more preferably 2000 Pa·s or less, and further preferably 100 to 2000 Pa·s, while satisfying the above-described ratio.

The second insulating resin layer can be formed by adjusting the viscosity in the same resin composition as that for the insulating resin layer 2.

The layer thickness of the second insulating resin layer can be appropriately set in accordance with use applications of the anisotropic conductive film. The layer thickness of the second insulating resin layer is preferably 4 to 20 µm, or 1 to 8 times the diameter of the conductive particle.

The minimum melt viscosity of the entire anisotropic conductive film containing the insulating resin layer 2 and the second insulating resin layer is 8000 Pa·s or less in practical use, may be 200 to 7000 Pa·s to be easily filled between bumps, and is preferably 200 to 4000 Pa·s, though it is determined in accordance with use applications of the anisotropic conductive film, the ratio in layer thickness between the insulating resin layer 2 and the second insulating resin layer, and the like.

A third insulating resin layer may be provided on the opposite side to the insulating resin layer 2 with the second insulating resin layer interposed therebetween. The third insulating resin layer can function as a tack layer. As in the second insulating resin layer, the third insulating resin layer may be provided to fill a space formed by electrodes and bumps of the electronic component.

The resin composition, viscosity, and layer thickness of the third insulating resin layer may be the same as or different from those of the second insulating resin layer. The minimum melt viscosity of the anisotropic conductive film containing the insulating resin layer 2, the second insulating resin layer, and the third insulating resin layer in combination is not specifically limited, but may be 8000 Pas or less, may be 200 to 7000 Pa·s, or may be 200 to 4000 Pa·s.

The above description about the second insulating resin layer and the third insulating resin layer is not applied only to the first invention, but may be applied to the second invention and a third invention.

[Second Invention]
(Entire Structure of Connection Structure)

Figure 3A:
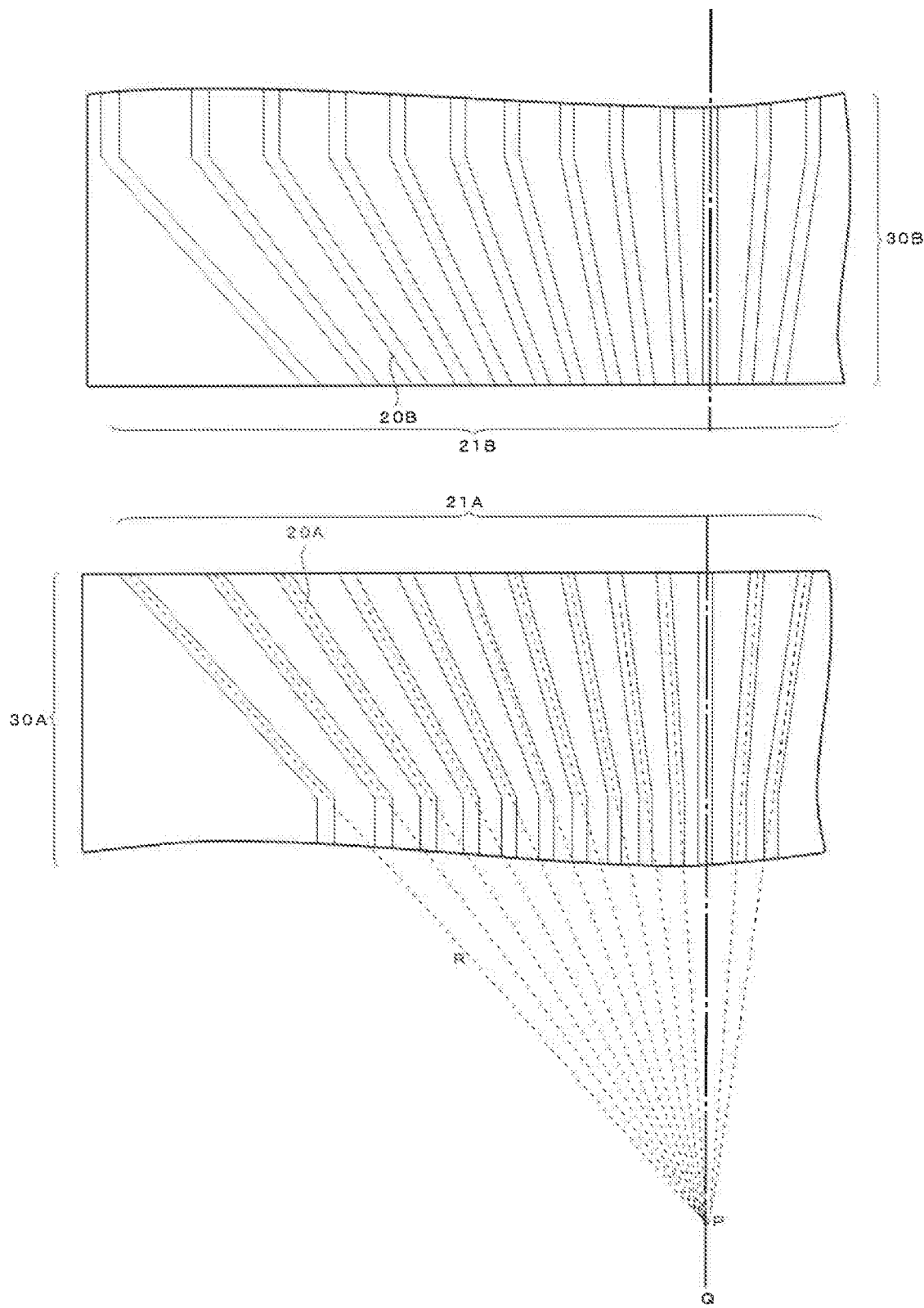
FIG. 3A is a plan view of terminal patterns of electronic components used in a production method of a connection structure according to a second invention.
Figure 3B:
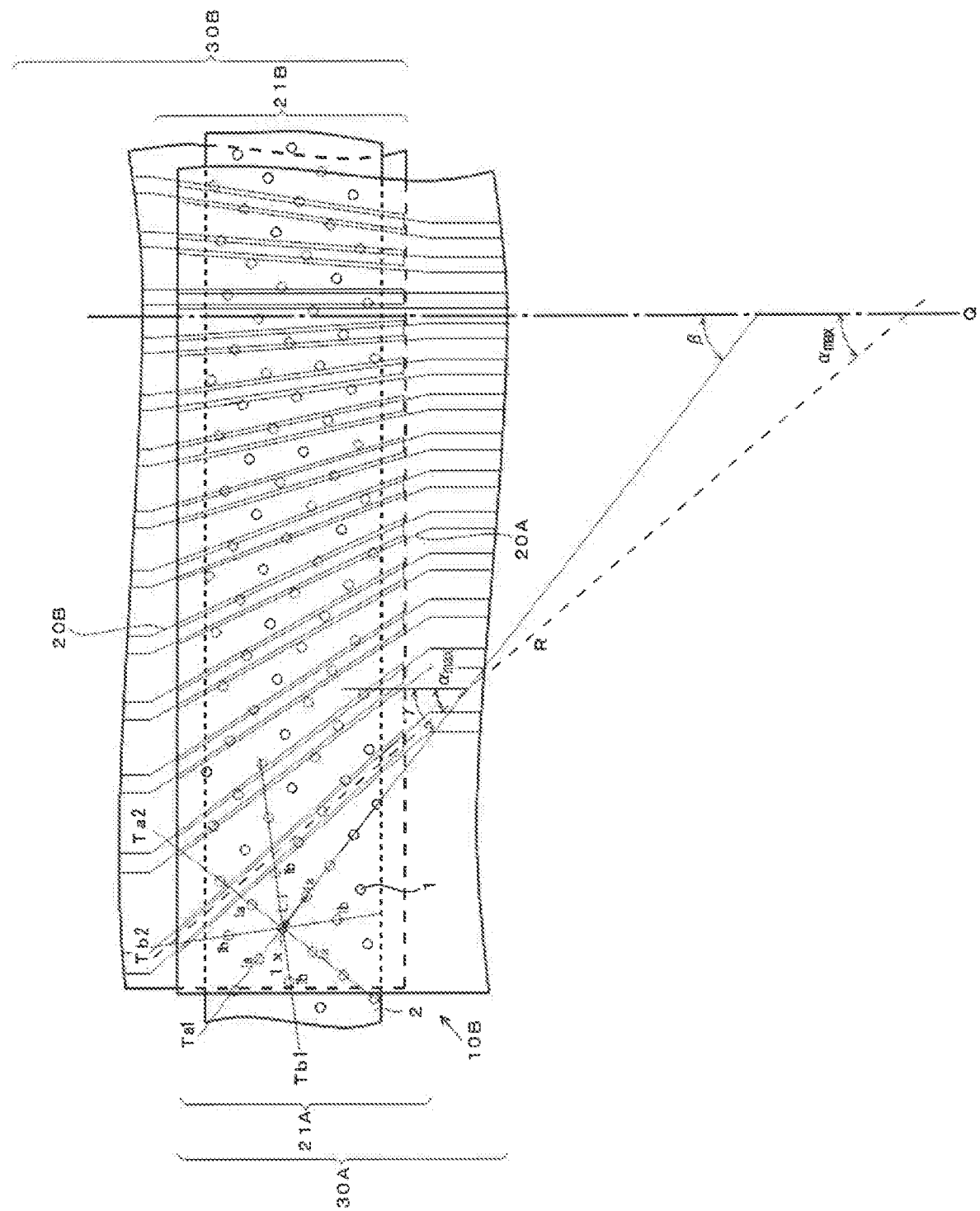
FIG. 3B is an explanatory view of an arrangement of conductive particles in a lattice form in an anisotropic conductive film used in the production method of the connection structure according to the second invention.

FIG. 3A is a plan view of a terminal pattern 21A of a first electronic component 30A and a terminal pattern 21B of a second electronic component 30B used in a production method of a connection structure according to a second invention, and FIG. 3B is an explanatory view of a captured state of conductive particles by terminals of the connection structure produced in the production method of the connection structure according to the second invention.

In the electronic components 30A and 30B illustrated in FIGS. 3A and 3B, as in the case of the electronic components 30A and 30B used in the first invention illustrated in FIG. 1A, a plurality of terminals 20A and 20B are arranged side by side in a radial form in the terminal patterns 21A and 21B.

However, the terminal patterns 21A and 21B of the electronic components 30A and 30B used in the second invention are different from those used in the first invention illustrated in FIG. 1A in terms that there is no limitation on an effective connection area per terminal, and there is no limitation on the number density of the conductive particles in the anisotropic conductive film 10B. Therefore, the second invention can be applied to a terminal pattern of a normal pitch and a terminal pattern of a fine pitch, and can be applied to terminals having, for example, a terminal width of 5 to 50 µm and preferably 5 to 25 µm, and a space between the terminals of 10 to 50 µm and preferably 10 to 25 µm.

On the other hand, in the second invention, an anisotropic conductive film in which conductive particles 1 are arranged in a lattice form in an insulating resin layer in a plan view is used as the anisotropic conductive film 10B, by way of example as illustrated in FIG. 3B, and an arrangement pitch and an arrangement direction in the lattice form arrangement are determined such that each terminal captures three or more conductive particles at an effective connection region between a first electronic component and a second electronic component. Note that, each terminal preferably captures three or more conductive particles in a film width direction. In the effective connection region, each terminal preferably captures 10 or more conductive particles, and more preferably captures 11 or more conductive particles.

The arrangement pitch and the arrangement direction can be appropriately determined in accordance with the terminal patterns 21A and 21B of the electronic components 30A and 30B. For example, in the anisotropic conductive film 10B illustrated in FIG. 3B, when the conductive particles 1 are arranged at an arrangement pitch (i.e. interstitial distance) of L1 in a square lattice, four conductive particles 1a are present around an arbitrary conductive particle 1x at the closest distance (interstitial distance) L1 of the distance between the centers of the conductive particles from the conductive particle 1x, and connecting between the conductive particle 1a and the conductive particles 1x draws arrangement axes Ta1 and Ta2. As conductive particles that are the next closest to the conductive particle 1x, four conductive particles 1b are present at 1.4 times the interstitial distance L1, and connecting between the conductive particles 1b and the conductive particle 1x draws arrangement axes Tb1 and Tb2. As to the arrangement axes Ta1, Ta2, Tb1 and Tb2, β represents an angle formed between the arrangement axis and a short-side direction of the terminal pattern 21A. On the other hand, $α_{max}$ represents a maximum angle of angles formed between the center axis (line R) extending in a long-side direction of each terminal 20A and the short-side direction of the terminal pattern 21A. At this time, the direction of the arrangement axis is determined such that the angle β that satisfies $β>α_{max}$ is present. As shown in FIG. 3B, in the arrangement axis Ta1 that satisfies $β>α_{max}$, the arrangement pitch L1 of the conductive particles is set shorter than the length of each terminal in the effective connection region. Each terminal necessarily intersects with the arrangement axis Ta1 in the effective connection region. Therefore, with the anisotropic conductive film 10B, each terminal can capture the conductive particles. This is on the precondition that a sufficient number of conductive particles are present in the short-side direction of the terminal pattern 21A. As a concrete example, in the arrangement axis of the anisotropic conductive film that is overlapped with the terminal pattern 21A in the short-side direction of the terminal pattern 21A, 5 or more conductive particles are preferably present in each terminal, more preferably 12 or more and further more preferably 13 or more conductive particles may be present therein. Although it depends on the inclination angle of the terminal, if the conductive particles are disposed densely, one terminal can capture three or more conductive particles. Therefore, by appropriately determining the arrangement pitch of the conductive particles in the arrangement axis that satisfies $β>α_{max}$, the number of the conductive particles captured by each terminal can be set to three or more in the effective connection region between the first electronic component and the second electronic component.

Examples of arrangement of the conductive particles in which the angle β satisfying $β>α_{max}$ is present may include (i) an arrangement of a hexagonal lattice and its lattice axis (in which an arrangement pitch of the conductive particles becomes minimum in the axis) coincides with the short-side direction of the terminal pattern 21, (ii) the hexagonal lattice arrangement of (i) is rotated by 30°, (iii) an arrangement of a square lattice and its lattice axis (in which an arrangement pitch of the conductive particles becomes minimum in the axis) coincides with the short-side direction of the terminal pattern 21, and (iv) the square lattice arrangement of (iii) is rotated by 45°. In the case of (i), the maximum value of 1 in FIG. 3B is 60°, and in the case of (ii), the maximum value of β in FIG. 3B is 30°. In the cases of (iii) and (iv), the maximum value of β in FIG. 3B is 45°. When the conductive particles are arranged in any of the arrangements of (i) to (iv), if the terminal pattern 21 is symmetrical, the terminal pattern 21 has the same capturing state at its left and right, thus facilitating determining the quality of connection.

To obtain an arrangement of the conductive particles in which the angle β satisfying $β>α_{max}$ is present, a particle disposition in which the hexagonal lattice or the square lattice is extended in a long-side direction or a short-side direction of the terminal pattern 21 may be adopted. For example, an arrangement axis Ta (an arrangement axis in which an arrangement pitch of the conductive particles is the smallest) of the square lattice of (iii) may be aligned with the short-side direction of the terminal pattern 21 and the square lattice may extend to the long-side direction of the terminal pattern into an arrangement of a rectangular lattice, or an arrangement axis Tb (an arrangement axis in which an arrangement pitch of the conductive particles is the second smallest) of the square lattice of (iv) may be aligned with the short-side direction of the terminal pattern 21 and the square lattice may extend to the long-side direction of the terminal pattern into an arrangement of a diagonal lattice (rhombic lattice).

When the arrangement axis having the smallest arrangement pitch of the conductive particles or the arrangement axis having the second smallest arrangement pitch is aligned with the short-side direction of the terminal pattern, arrangement axes that are in parallel with the short-side direction of the arrangement pattern are present in the anisotropic conductive film, and the lattice arrangement becomes symmetrical. If the arrangement pattern is symmetrical in the long-side direction, the capturing state becomes the same or substantially the same on left and right. Accordingly, the capturing state can be easily determined, thus having an advantage in the productivity of the connection structure.

Note that, in FIG. 3B, the arrangement axis Ta1 in which the distance between the centers of the conductive particles is the smallest is aligned with the short-side direction of the terminal pattern 21A, but is sometimes preferably aligned with the long-side direction of the terminal pattern 21A. FIG. 3B is on the precondition that a sufficient number of conductive particles are present in the short-side direction of the terminal pattern, but when the length of terminals is limited such as in an IC chip, aligning the arrangement axis (having the smallest arrangement pitch of the conductive particles, out of the arrangement axes of the anisotropic conductive film) with a short direction of the terminal length facilitates making the number of captured conductive particles per terminal satisfy a predetermined number or more.

In the hexagonal lattice arrangement in which the arrangement axis is oriented in the direction of (i), the maximum value of β can be set to 60°, but enlarging or shrinking the lattice allows adjustment in the maximum value of β. When the conductive particles are arranged in the hexagonal lattice, the square lattice, or enlargement or shrinkage thereof, the lower limit of the maximum value of β may be 5° or more, preferably 15° or more, and more preferably 30° or more. The upper limit thereof may be 85° or less, preferably 75° or less, and more preferably 60° or less. This is because if the inclination angle is either too small or too large, the conductive particles are disposed densely in a portion, and therefore the invention may be difficult to be applied to a fine pitch.

In the anisotropic conductive film 10B used in the second invention, when γ represents an angle formed between the arrangement axis Ta1, Ta2, Tb1 or Tb2 and the short-side direction of the anisotropic conductive film 10B, $γ>α_{max}$ is preferably satisfied. Accordingly, in a case where the first electronic component 30A and the second electronic component 30B are anisotropically conductively connected by using the anisotropic conductive film 10B, the above $β>α_{max}$ is satisfied by aligning the short-side direction of the anisotropic conductive film 10B with the short-side direction of the terminal pattern (β=γ holds true, when the long-side direction of the terminal pattern coincides with the long-side direction of the anisotropic conductive film at the time of anisotropic conductive connection).

Examples of the lattice arrangement of the conductive particles in the anisotropic conductive film used in the second invention may include a hexagonal lattice, a rhombic lattice, and a rectangular lattice, in addition to the square lattice illustrated in FIG. 3B.

The configuration and the number density of the conductive particles themselves in the anisotropic conductive film, the configuration of the insulating resin layer and the like used in the second invention may be the same as those of the first invention.

[Third Invention]

(Entire Structure of Connection Structure)

A third invention uses an anisotropic conductive film having a multiple circular region for disposing conductive particles, instead of the anisotropic conductive film used in the aforementioned second invention.

Figure 4:
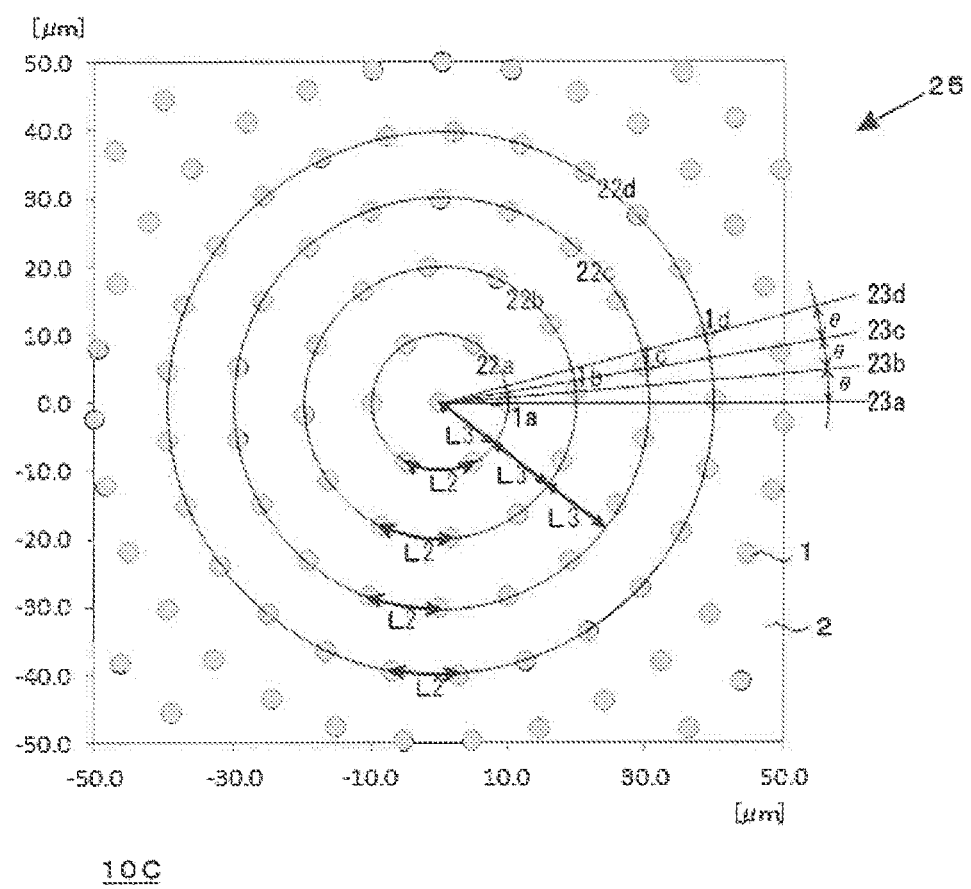
FIG. 4 is an explanatory view of a multiple circular region in an anisotropic conductive film used in a production method of a connection structure according to a third invention.

As the multiple circular region, for example, there is a multiple circular region 25 illustrated in FIG. 4. In the multiple circular region 25, conductive particles 1 are disposed on a plurality of concentric circles in an insulating resin layer 2 in a plan view of an anisotropic conductive film 10C. On the concentric circles, the conductive particles are preferably disposed at predetermined intervals (constant distance L2 between the centers of the conductive particles) to reduce man-hours required of design of the arrangement. When a first line 23a refers to a line connecting between a first conductive particle 1a on a first concentric circle 22a and the center of the circles, and a second line 23b refers to a line connecting between a second conductive particle 1b, which is a conductive particle on a second concentric circle 22b adjacent to the first concentric circle 22a and is nearest to the first conductive particle 1a, and the center of the circles, the conductive particles are preferably disposed such that the first line 23a does not coincide with the second line 23b, in order to allow both improvement in the capturing properties and prevention of a short circuit.

Furthermore, in the multiple circular region 25 illustrated in FIG. 4, when a third line 23c refers to a line connected between a third conductive particle 1c, which is a conductive particle on a third concentric circle 22c adjacent to the second concentric circle 22b and is nearest to the second conductive particle 1b, and the center of the circles, an angle θ formed between the second line 23b and the first line 23a is equal to an angle θ formed between the third line 23c and the second line 23b, and an angle formed between a fourth line 23d, which is determined in the same manner, and the third line 23c is equal to the above-described angle θ. When terminals are arranged in a radial form in such a way that the lines 23a, 23b, 23c, and 23d are inclined by the constant angle θ as described above, each terminal captures the conductive particle at any position. The size of the angle θ is preferably 1 to 40°, from the viewpoints of prevention of a short circuit and capture stability by a reduction in the number of conductive particles.

As in the case of the multiple circular region 25 illustrated in FIG. 4, a distance L3 between concentric circles (difference in radiuses of the adjacent concentric circles) may be equal to a distance L2 between the centers of the conductive particles on each concentric circle. Since equalizing the distance L3 between the concentric circles and the distance L2 between the centers of the conductive particles on each concentric circle can determine design specifications in disposition of the conductive particles, quality management in production of the anisotropic conductive film can be favorably performed. A particle disposition similar to a hexagonal lattice can thereby be recognized in the multiple circular region 25, so that it becomes possible to densely dispose the conductive particles and improve the capturing properties.

In the anisotropic conductive film 10C used in the third invention, the disposition of the conductive particles is formed of the above-described multiple circular region. In this case, the anisotropic conductive film may be formed of the single multiple circular region, or a plurality of the multiple circular regions. By cutting the anisotropic conductive film formed of the single multiple circular region into long band shapes to obtain anisotropic conductive film products (in other words, by cutting the anisotropic conductive film having the particle disposition of FIGS. 5A and 5B into band-shaped anisotropic conductive films), a film having a particle disposition in which curved particle arrangements are arranged side by side can be obtained. By using the anisotropic conductive film having the particle disposition, when the inclination angles of the individual terminals gradually vary, as in the case of the terminal pattern in a radial form, it is conceivable to easily obtain stable capture ability.

On the other hand, by cutting the anisotropic conductive film formed of the plurality of multiple circular regions into long band shapes to the anisotropic conductive film products, as described later, the ratio between the length of the anisotropic conductive film used in production of a single connection structure and a maximum length of the multiple circular region can be made to be an integer, and thereby a particle capturing state of the connection region can be easily compared. Therefore, it becomes easy to determine the quality, and hence is effective at reducing production costs of an anisotropic connection structure.

Figure 5A:
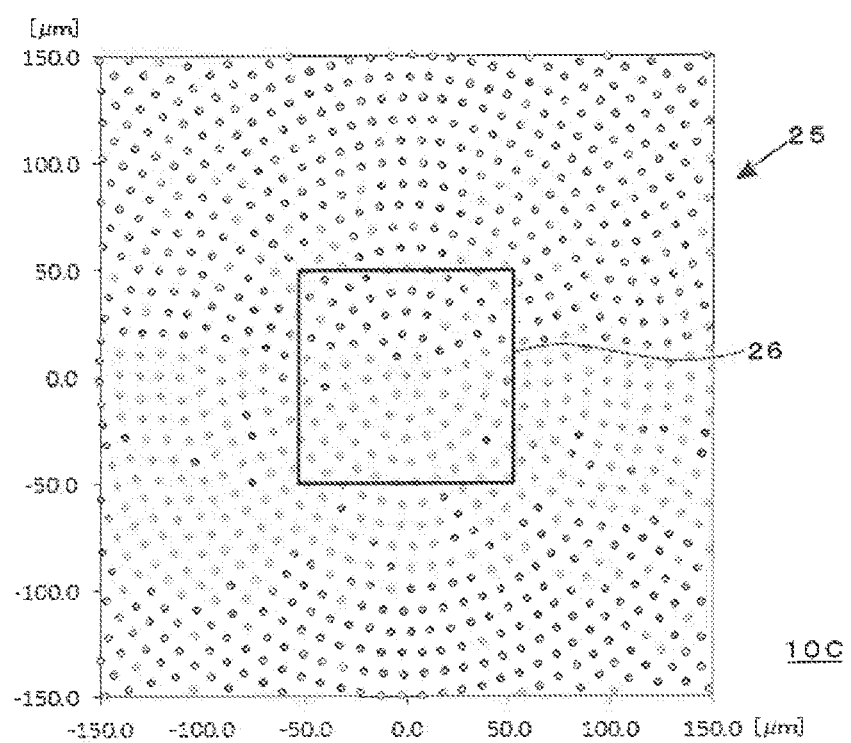
FIG. 5A is an explanatory view of a rectangular region to be cut out from the multiple circular region.
Figure 5B:
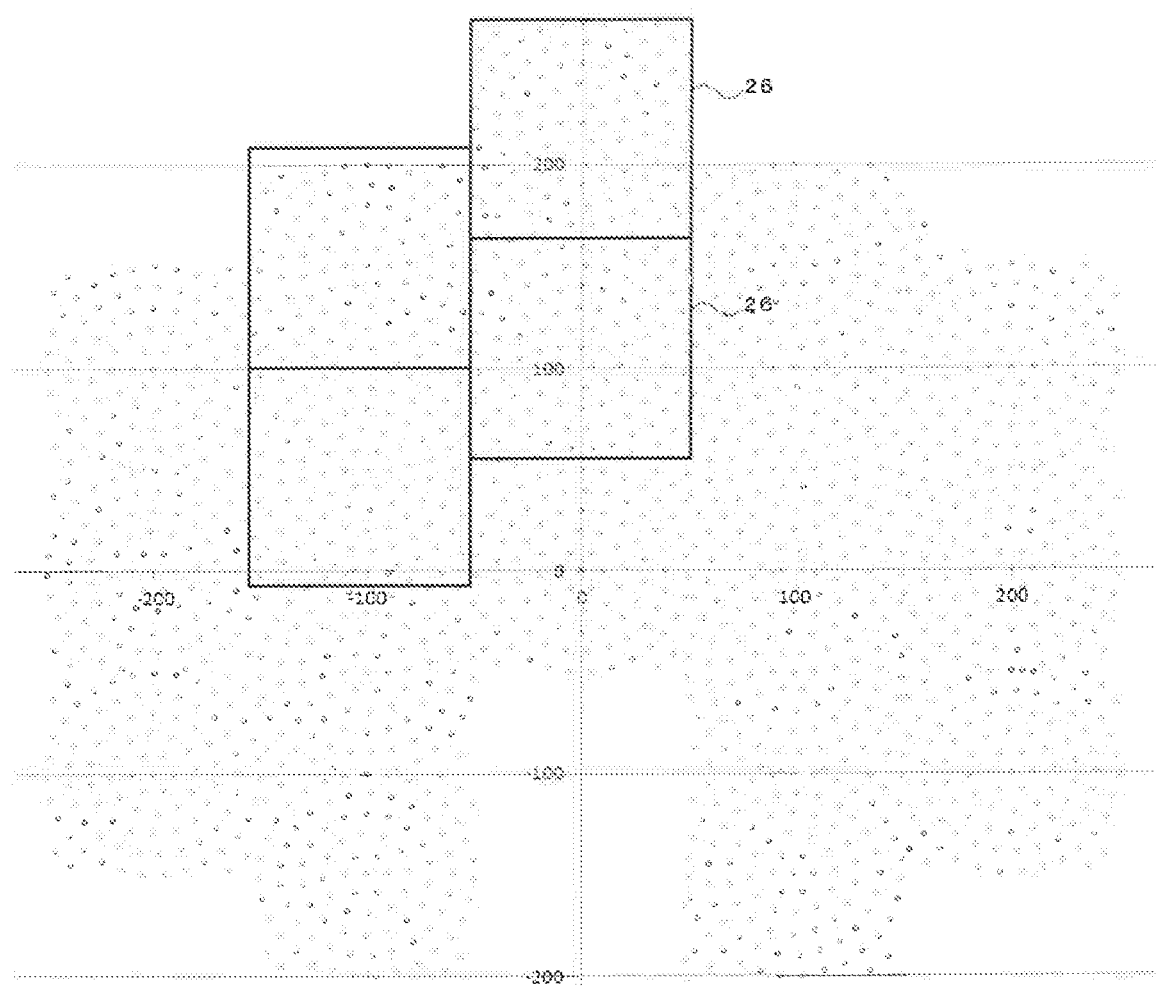
FIG. 5B is an explanatory view of a disposition of conductive particles in an anisotropic conductive film in which the rectangular regions cut out from the multiple circular regions are carpeted.

In the case of using the plurality of multiple circular regions, the disposition of the conductive particles in the anisotropic conductive film may be, for example, as illustrated in FIG. 5A, a disposition in which a region of a predetermined form (e.g., a square area 26) is cut out from the multiple circular region 25 having many concentric circles, and as illustrated in FIG. 5B, the cutout regions are disposed without any gap. In a case where the cutout regions are disposed without any gap, if the conductive particles overlap in the adjacent multiple circular regions, or if the distance between the adjacent conductive particles is within twice, and preferably within 0.5 times the diameter of the conductive particle, one of the conductive particles can be removed for the purpose of preventing a short circuit.

Figure 6A:
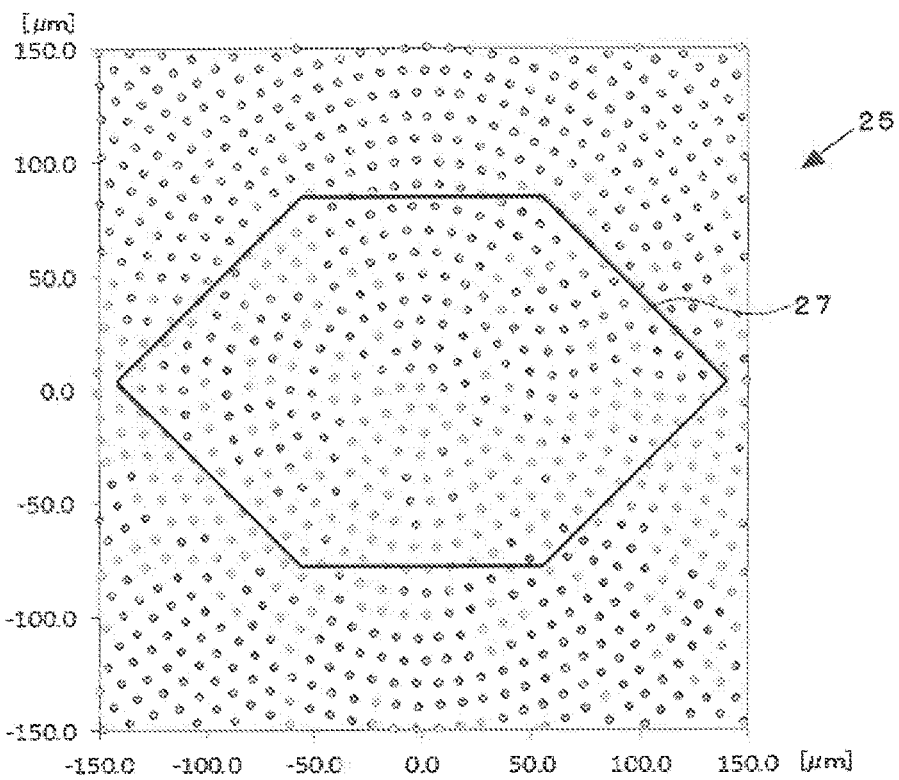
FIG. 6A is an explanatory view of a hexagonal region to be cut out from the multiple circular region.
Figure 6B:
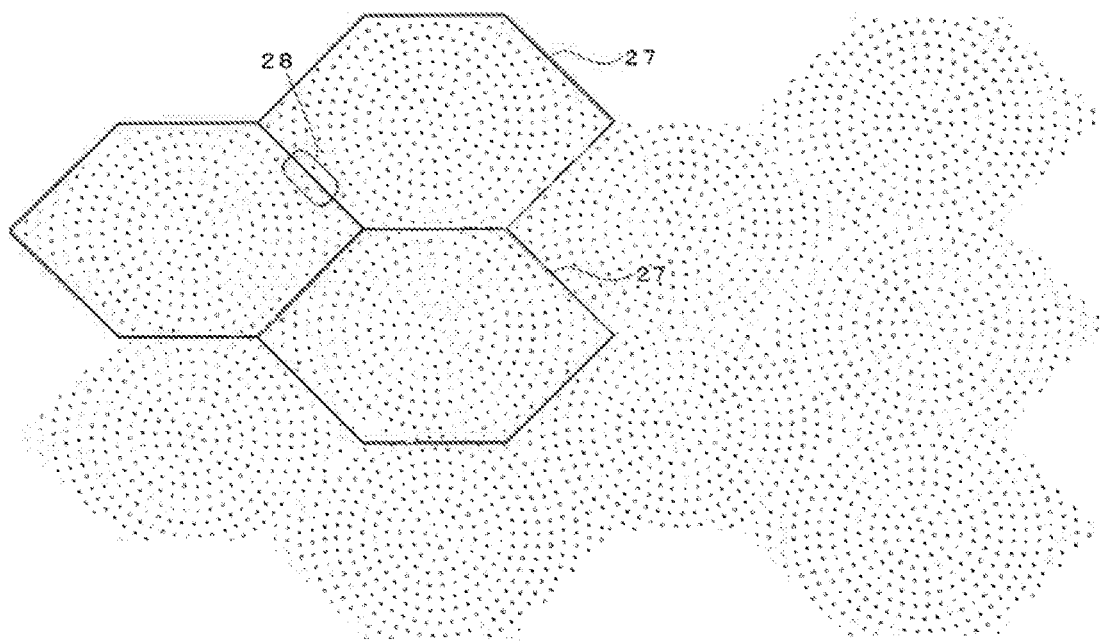
FIG. 6B is an explanatory view of a disposition of conductive particles in an anisotropic conductive film in which the hexagonal regions cut out from the multiple circular regions are carpeted.

There is no limitation in the form cut out from the multiple circular region 25. As illustrated in FIG. 6A, a hexagonal region 27 may be cut out from the multiple circular region 25 having many concentric circles, and as illustrated in FIG. 6B, the cut hexagonal regions 27 may be disposed without any gap. A triangular form or a tetragonal form such as a rectangle or rhombus may be cut out. In the form of a polygon cut out from the multiple circular region 25, the number and the lengths of sides may be appropriately selectable, such that the cut shapes can be disposed without any gap. Two or more types of polygon regions may be cut out and disposed without any gap.

The length Lf of the anisotropic conductive film used in production of the single connection structure can be determined from the viewpoints of productivity and the like of the connection structure, such that even in the case of continuously connecting the plurality of connection structures, capture of the conductive particles is stabilized in each connection structure. For example, by setting the maximum length Lx of the single multiple circular region in a film long-side direction of the anisotropic conductive film to be equal to or more than an integral submultiple of the width of the terminal pattern of the electronic component constituting the connection structure (in other words, the length Lf of the anisotropic conductive film used in the production of the signal connection structure) (in other words, the length Lf of the above-described anisotropic conductive film is set equal to or less than an integral multiple of the maximum length Lx of the single multiple circular region formed in the anisotropic conductive film), the same number of multiple circular regions can be included in production of each individual connection structure, so that there is an advantage that the captured state of the conductive particles can be easily compared between the continuously produced connection structures. The above-described integral submultiple is more specifically preferably 1/200 or more (the length Lf of the anisotropic conductive film is 200 times or less the maximum length Lx of the multiple circular region), and more preferably 1/100 or more (100 times or less), and further preferably 1/50 or more (50 times or less). The preferable numerical value of the ratio Lx/Lf between [the maximum length Lx of the single multiple circular region] and [the length Lf of the anisotropic conductive film used in production of the single connection structure] varies in accordance with the length of the used film and layout of the terminals to be connected, and therefore is not limited to the above-described values. On the other hand, with respect to the length Lf of the anisotropic conductive film used in production of the single connection structure, the maximum length Lx of the single multiple circular region contained therein is not specifically limited, but by way of example, may be set to 10 times or less, preferably 5 times or less, more preferably 2 times or less, and further more preferably 1.2 times or less, in order to ease comparison of the captured state of the conductive particles among the produced plurality of connection structures. Therefore, when the connection structures are produced continuously, the anisotropic conductive films having the same particle arrangements are connected in each connection structure, so that this is expected to facilitate producing the connection structures with stable quality.

When the regions cutout from the multiple circular regions 25 are disposed without any gap, one of the conductive particles that overlap in the adjacent regions and one of the conductive particles in which the distance between the adjacent conductive particles is within twice and preferably within 0.5 times the diameter of the conductive particle are preferably removed. For example, at a joint portion between the adjacent regions, outermost circles of the multiple circular regions 25 may be connected as continuous curves, as illustrated in a joint portion 28 of FIG. 6B. This likely has the effect of making it easier to prevent irregular failures (a reduction in the number of captured conductive particles by the terminal, the occurrence of a short circuit and the like) at the joint portions of the cutout multiple circular regions 25. A conductive particle may be intentionally disposed in a portion the particle density of which becomes locally low, such as in the joint portion 28.

Figure 7A:
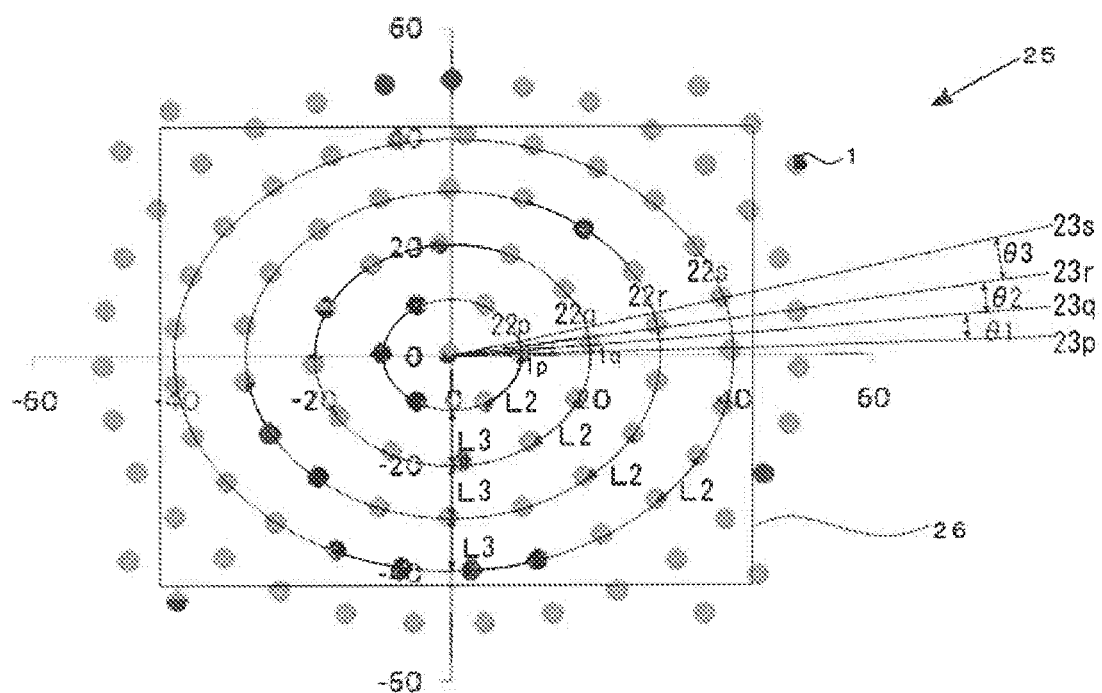
FIG. 7A is an explanatory view of a multiple circular region in which concentric circles are elliptical, and a rectangular region to be cut out from the multiple circular region.

In the third invention, the concentric circles that form the multiple circular region may be elliptical. For example, as illustrated in FIG. 7A, the multiple circular region 25 may be formed of a plurality of concentric ellipses 22p, 22q, 22r and 22s. In this case, the distance L2 between the centers of the conductive particles on each concentric ellipse is constant, and the distance L2 is equal to the distance L3 between the ellipses in a minor radius direction. Note that, in the present invention, the distance between the ellipses in a major radius direction may be equal to the distance L2 between the centers of the conductive particles on the ellipses.

When a first line 23p refers to a line connecting between a first conductive particle 1p on a first concentric ellipse 22p and the center of the ellipses, and a second line 23q refers to a line connecting between a second conductive particle 1q, which is a conductive particle on a second concentric ellipse 22q adjacent to the first concentric ellipse and is the nearest to the first conductive particle 1p, and the center of the ellipses, the conductive particles are disposed such that the first line 23p and the second line 23q do not coincide with each other. When a third line 23r and a fourth line 23s are defined in the same manner, an angle θ1 formed between the first line 23p and the second line 23q, an angle θ2 formed between the second line 23q and the third line 23r, and an angle θ3 formed between the third line 23r and the fourth line 23s may be the same or different.

Figure 7B:
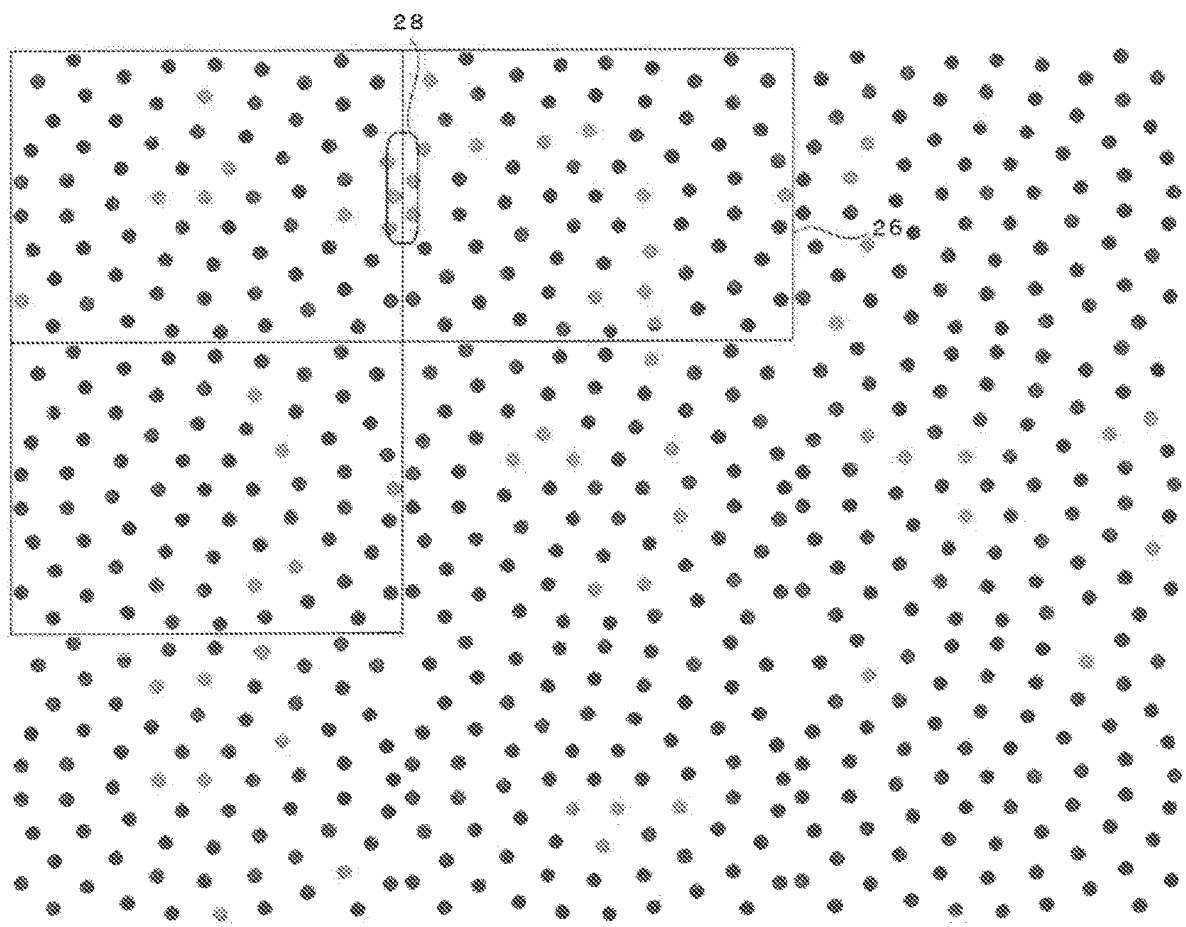
FIG. 7B is an explanatory view of a disposition of conductive particles in an anisotropic conductive film in which the rectangular regions cut out from the multiple circular regions made of the elliptical concentric circles are carpeted.

As illustrated in FIG. 7A, even in a case where the concentric circles that form the multiple circular region 25 are elliptical, as illustrated in FIG. 7B, the conductive particles 1 may be disposed in an anisotropic conductive film by cutting out regions of a predetermined form (e.g., rectangular regions 26) and arranging the cutout regions without any gap. In a case where the cutout regions are arranged without any gap, the overlapping conductive particles or the conductive particles in which the distance between the conductive particles is within twice, and preferably within 0.5 times the diameter of the conductive particle are preferably removed, for the purpose of preventing a short circuit. In this case, a conductive particle may be intentionally disposed in a portion the particle density of which becomes locally low, such as in a joint portion 28. As described above, the present invention includes a band-shaped anisotropic conductive film obtained by cutting the anisotropic conductive film having the multiple circular region 25 into a band shape, and as shown in FIGS. 7A and 7B, also includes a band-shaped anisotropic conductive film obtained by arranging the regions cut out from the multiple circular regions without any gap and then cutting into a band shape. Therefore, the curved particle arrangements sometimes appear side by side or continuously in the band-shaped anisotropic conductive film.

The structure and the number density of the conductive particles themselves in the anisotropic conductive film, the configuration of the insulating resin layer and the like used in the third invention may be the same as those of the first and second inventions.

When the anisotropic conductive film according to the third invention is used, an arbitrary conductive particle and two or more conductive particles in the vicinity of the conductive particle are not aligned, so that it is possible to improve the conductive particle capturing properties of at each terminal, irrespective of the size and pitch of the terminals in the first and second electronic components for anisotropic conductive connection. This is because, in a line connecting between conductive particles, another conductive particle can exist without overlapping, so that even if a terminal is inclined, any conductive particle to be captured by the terminal can exist if the terminal is sufficiently long in a long-side direction. Therefore, the present invention encompasses the anisotropic conductive film used in the third invention. The present invention also includes the connection structures produced by the methods of the above first, second, and third inventions.

[Method for Producing Anisotropic Conductive Film]

The anisotropic conductive films used in the first, second and third inventions have the disposition and density of conductive particles suited to the individual inventions, but a method itself for producing the anisotropic conductive films in which the conductive particles have the specific particle disposition and particle density is not specifically limited. For example, a transfer mold is produced to dispose conductive particles in a predetermined arrangement. The conductive particles are charged into concave portions of the transfer mold, and a pressure is applied thereon in a state that the transfer mold is covered with an insulating resin layer formed in a separation film. By pushing the conductive particles into the insulating resin layer, the conductive particles are transferred and fixed to the insulating resin layer. An insulating adhesive layer may be further laminated on the conductive particles. The anisotropic conductive film can be thereby obtained.

Alternatively, to produce the anisotropic conductive film, after the conductive particles are charged into the concave portions of the transfer mold, the transfer mold may be covered with the insulating resin layer to transfer the conductive particles from the transfer mold to the surface of the insulating resin layer, and the conductive particles on the insulating resin layer may be pushed into the insulating resin layer.

Note that, as the transfer mold, a mold in which a weak pressure-sensitive adhesive is applied to top surfaces of convex portions and the conductive particles adhere to the top surfaces may be used, instead of the mold in which the conductive particles are charged into the concave portions. The transfer mold can be produced by a well-known technology including machining, photolithography, printing or the like.

As a method for disposing the conductive particles in a predetermined arrangement, a method using a biaxially stretched film or the like may be used, instead of the method using the transfer mold. A method in which the conductive particles are passed through holes provided in a predetermined disposition or the like may be used instead.

[Method for Producing Connection Structure]

In any of the first, second and third inventions, the anisotropic conductive film that is suitable for the first and second electronic components to be connected is used, and the connection structure in which the first and second electronic components are anisotropically conductively connected by pressure heating the first and second electronic components is obtained, but in this case, the pressure heating method itself is not specifically limited.

For example, when one of electronic components is disposed on a stage, and the other electronic component is disposed thereon through an anisotropic conductive film, and a connection structure is produced by press heating by a pressure bonding tool, the electronic component disposed on the stage is assigned as a second electronic component such as an IC chip, an IC module, an FPC, a glass substrate, a plastic substrate, a rigid substrate, or a ceramic substrate, and the electronic component that is press heated by the pressure bonding tool is assigned as a first electronic component such as an FPC, an IC chip, or an IC module. The anisotropic conductive film is temporarily attached and pressure bonded on the second electronic component such as a substrate of any type, and the first electronic component such as an IC chip is attached and thermally pressure bonded on the temporarily pressure bonded anisotropic conductive film, to produce a connection structure. The connection structure may be produced by temporarily attaching the anisotropic conductive film to the first electronic component, instead of to the second electronic component. The connection method according to the present invention is not limited to the thermocompression bonding, but includes well-known aspects such as pressure bonding using photocuring and pressure bonding using both heat and light.

However, the method for producing the connection structure according to the present invention has significant meaning when at least one of the first and second electronic components is made of a thermally expandable material such as an FPC or a plastic substrate, and in particular, has more significant meaning when both of the first and second electronic components are made of thermally expandable materials.

On the other hand, the electronic component to be connected encompasses a component having a multistage terminal pattern such as an IC chip, having a terminal pattern formed on opposite sides of a rectangular connection surface or the like. The electronic component encompasses a component in which a terminal pattern is formed on all four sides. In a practically preferable aspect, since alignment can be adjusted only in a short-side direction of the electronic component, a major terminal pattern is present only in a long-side direction of the electronic component.

EXAMPLES

The present invention will be described below in the concrete by way of examples.

Example 1

In the case of producing a connection structure in which terminal patterns having radially arranged terminals were connected to each other, the number of conductive particles captured by each terminal was determined by overlapping the terminal patterns having the radially arranged terminals and a particle arrangement by drawing figures. The connection structure was determined to be OK when the terminal captured three or more conductive particles at the minimum, and determined to be NG when the terminal captured less than three conductive particles.

In this case, a first electronic component had a terminal pattern of the following form.

Figure 8A:
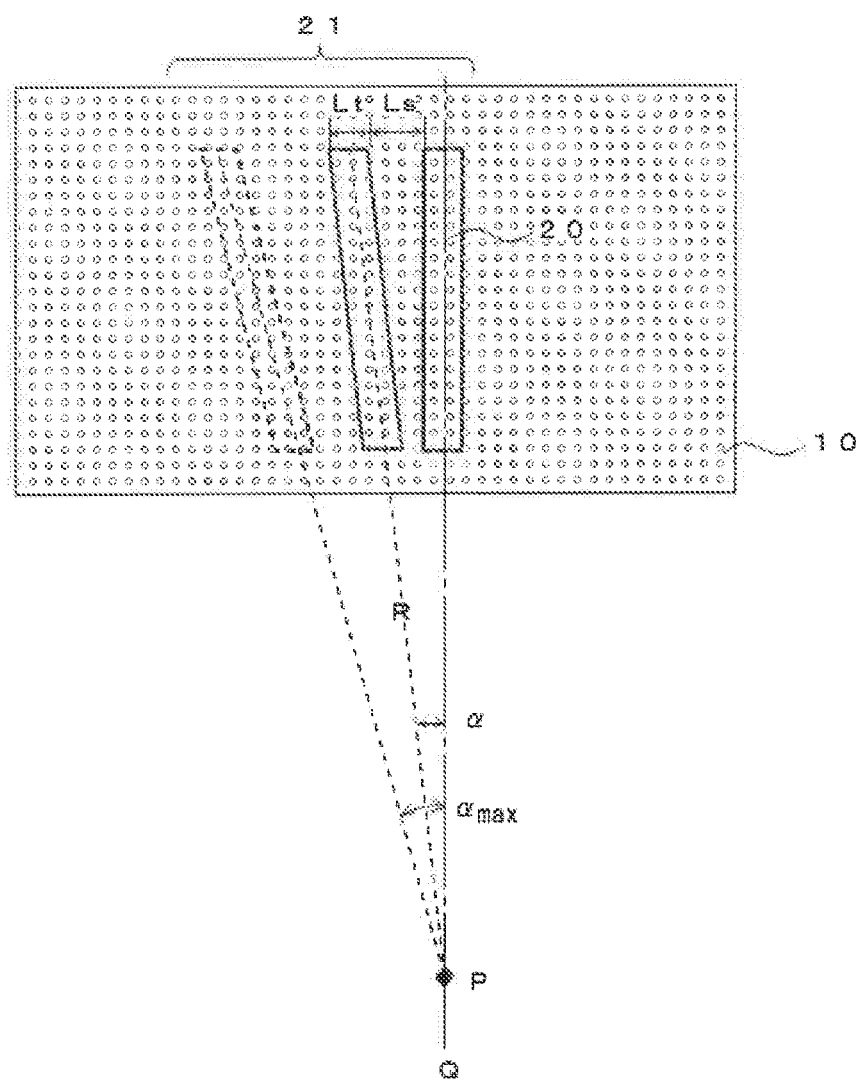
FIG. 8A is a view illustrating the relationship between a disposition of conductive particles and terminals according to an embodiment.

(1) As a terminal pattern 21, as shown in FIG. 8A, a radial arrangement having two terminals was presumed.
(2) The angle α formed between a center line Q of the terminal pattern 21 and a center line R extending in a long-side direction of a terminal 20 was varied by angles of 0.01 to 1°, and a maximum value $α_{max}$ was set to 14°.
(3) A terminal width Lt on the opposite side from a point P was 100 μm, a terminal length was 1000 μm, and a space Ls between the terminals was 100 μm.

An effective connection area of the terminals of the first and second electronic components was 100000 μm².

In an anisotropic conductive film 10, conductive particles had a particle diameter of 3.2 μm, a random disposition and a number density of 4000 particles/mm². As the random disposition state of the conductive particles, a binder resin was mixed and kneaded with the conductive particles so as to have a number density of 4000 particles/mm², and outlines of the conductive particles were extracted and drawn from a plan-view image obtained from an actual anisotropic conductive film having a film thickness of 20 μm.

As a result, in a case where the center line R of the terminal 20 was inclined to the maximum value $α_{max}$, the minimum capture number of the conductive particles by the terminal 20 was evaluated to be OK, and there was no instance in which the terminal 20 captured no conductive particles, even if the angle formed between the center line Q and the center line R took any value.

Comparative Example 1

The number of conductive particles captured by each terminal was determined using the same terminal pattern as that in Example 1 in a simulation in the same manner as that in Example 1, except that the terminal width Lt was set to 10 μm, the space Ls between terminals was set to 20 μm, and the effective connection area was set to 2000 μm² in Example 1.

As a result, the minimum capture number of the conductive particles by the terminal was 0, and therefore evaluated to be NG.

Comparative Example 2

The number of conductive particles captured by each terminal was determined in a simulation in the same manner as that in Example 1, except that the number density of the conductive particles was set to less than 2000 particles/mm² in Example 1.

As a result, the minimum capture number of the conductive particles by the terminal was 0, and therefore evaluated to be NG.

Example 2

The number of conductive particles captured by the terminal was determined by drawing figures, using the same terminal pattern as that in Example 1 in the same manner as that in Example 1.

In an anisotropic conductive film, conductive particles had a particle diameter of 3.2 μm, a square lattice disposition, and an interstitial distance (distance between centers of conductive particles) of 10 μm.

As a result, in a case where the center line R of the terminal 20 was inclined to the maximum value $\alpha_{max}$, the minimum capture number of the conductive particles by the terminal 20 was evaluated to be OK, and there was no instance in which the terminal 20 captured no conductive particles, even if the angle formed between the center line Q and the center line R took any value.

Comparative Example 3

In Example 2, the angle $\alpha_{max}$ was set to 10° and the interstitial distance was set to 20 μm.

As a result, the minimum capture number of the conductive particles by the terminal was zero, and therefore evaluated to be NG.

Example 3

The number of conductive particles captured by a terminal was determined by drawing figures, using the same terminal pattern as that in Example 1 in the same manner as that in Example 1. However, an anisotropic conductive film had the following conductive particle disposition.

Namely, the anisotropic conductive film had a multiple circular region illustrated in FIG. 5B. In this case, the multiple circular region had the following specifications.

The diameter of a first concentric circle was 20 μm.
The distance L2 between the centers of the conductive particles on each concentric circle was 10 μm.
The distance L3 between concentric circles was 10 μm.
The angle θ formed between a first line 23a and a second line 23b was 5°.
A cutout rectangular region was a square the side of which was 100 μm.
As a result, the minimum capture number of the conductive particles by the terminal was evaluated to be OK.

Figure 8B:
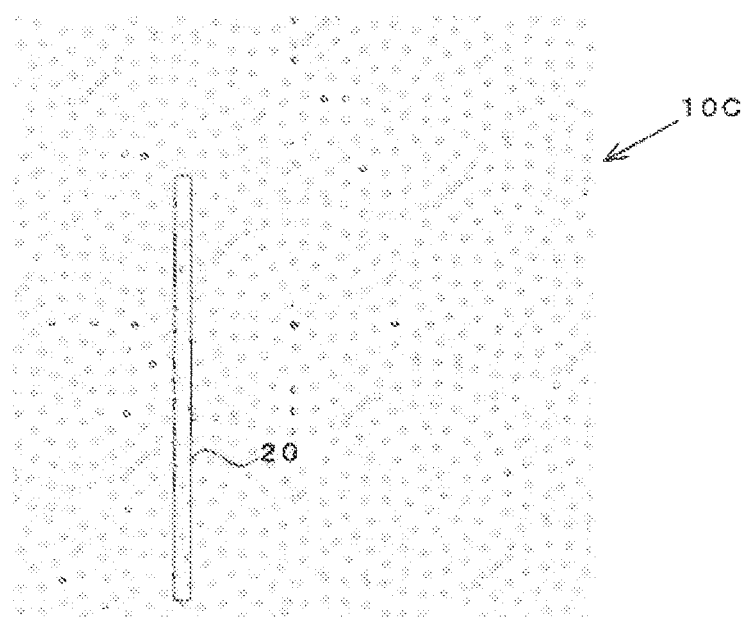
FIG. 8B is a view illustrating the relationship between a disposition of conductive particles and terminals according to an embodiment.
Figure 9:
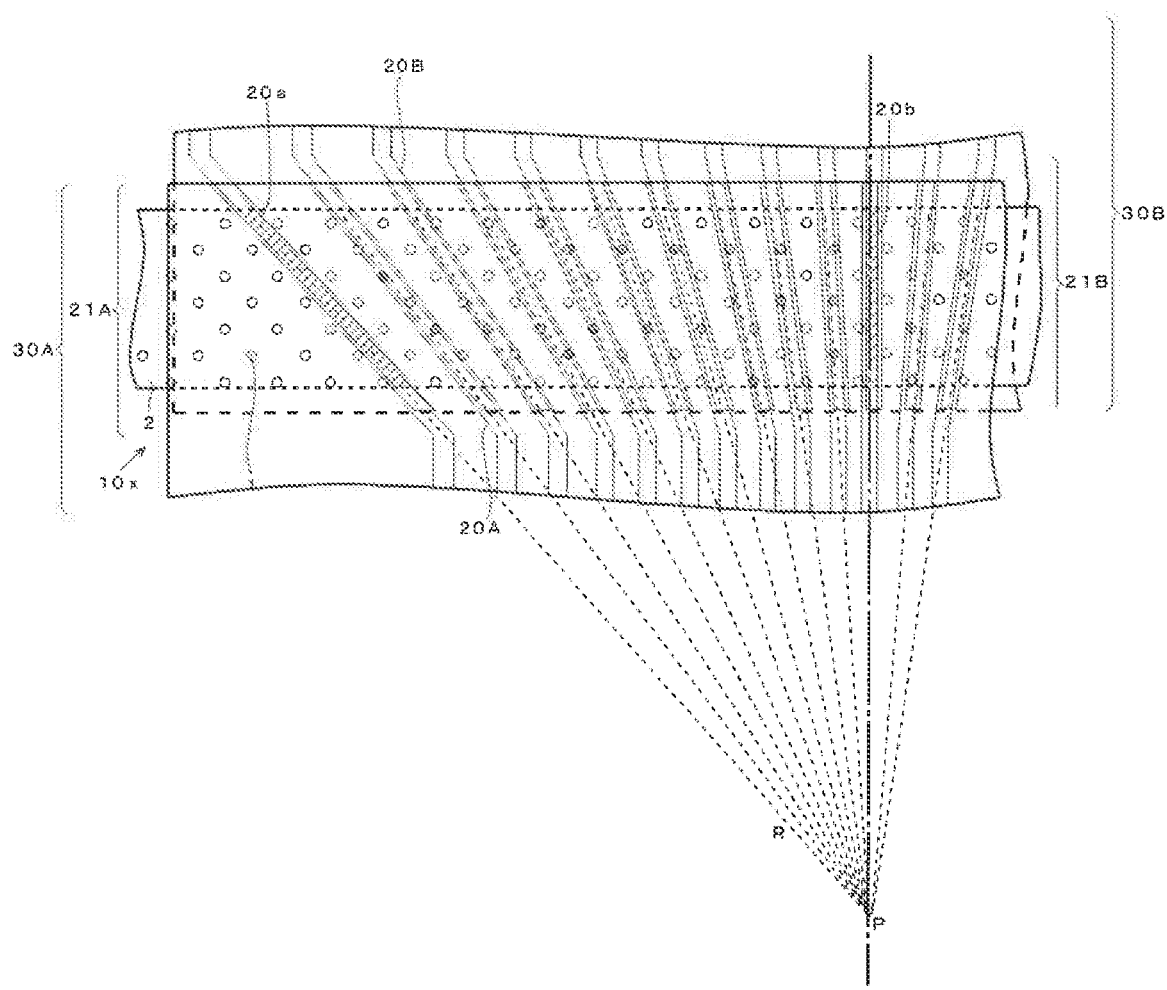
FIG. 9 is an explanatory view of a captured state of conductive particles by terminals of a conventional connection structure, in which a plurality of terminals are arranged side by side in a radial form.
Figure 10:
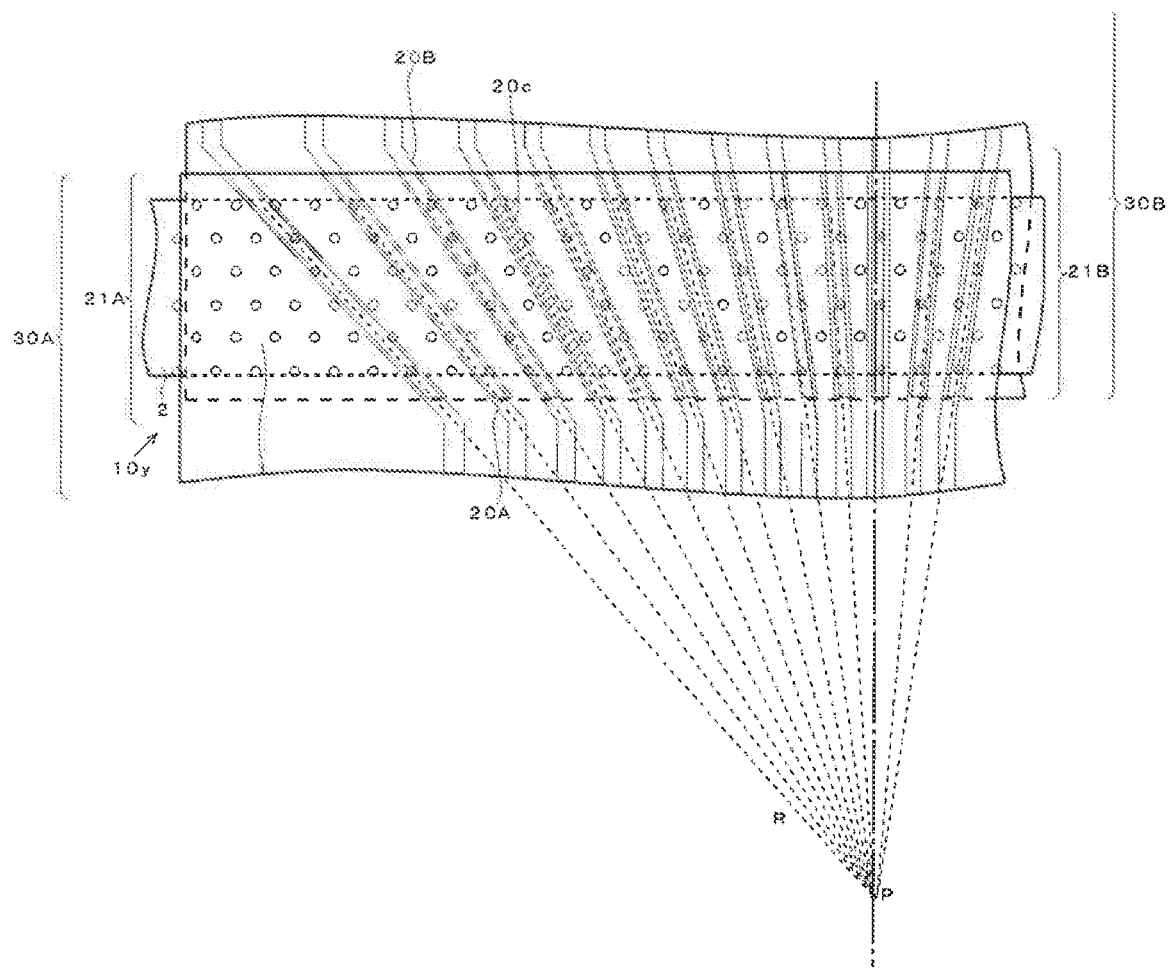
FIG. 10 is an explanatory view of a captured state of conductive particles by terminals of a conventional connection structure, in which a plurality of terminals are arranged side by side in a radial form.

Note that, as illustrated in FIG. 8B, when one terminal 20 (200 μm×10 μm) was disposed on the above-described anisotropic conductive film 10C, and the terminal was rotated about the center of the terminal from 0° to 360° at intervals of 1°, the number of conductive particles captured by the terminal was measured. As results, the minimum capture number of the conductive particles was 6 at an angle of 40°, and there was no terminal that captured no conductive particles.

REFERENCE SIGNS LIST

1, 1a, 1b, 1c, 1p, 1q, 1x conductive particle
2 insulating resin layer
3 conductive particle dispersed layer
10, 10x, 10y, 10A, 10B, 10C anisotropic conductive film
20, 20A, 20B terminal
20C effective connection region
21 terminal pattern
21A terminal pattern of first electronic component
21B terminal pattern of second electronic component
22a, 22b, 22c, 22d concentric circle
22p, 22q, 22r, 22s concentric ellipse
23a first line
23b second line
23c third line
23d fourth line
25 multiple circular region
26 region
27 hexagonal region
28 joint portion
30A first electronic component
30B second electronic component
L1 arrangement pitch (interstitial distance)
L2 distance between centers of conductive particles on concentric circle (on concentric ellipse)
L3 distance between concentric circles (between concentric ellipses)
P point outside terminal pattern
Q center line of terminal pattern passing through point P
R center axis of terminal
T arrangement axis

The invention claimed is:

1. A method for producing a connection structure in which a first electronic component having a terminal pattern in which a plurality of terminals are arranged side by side in a radial form and a second electronic component having a terminal pattern corresponding to the terminal pattern of the first electronic component are anisotropically conductively connected using an anisotropic conductive film, wherein
  an effective connection area per terminal is 3000 μm² or more, and
  a number density of conductive particles in the anisotropic conductive film is 2000 particles/mm² or more and 20000 particles/mm² or less,
  the anisotropic conductive film is an anisotropic conductive film in which conductive particles are arranged in a lattice form in an insulating resin layer in a plan view, and the lattice form arrangement has such an arrangement pitch and an arrangement direction that each terminal captures three or more conductive particles in effective connection regions of the first electronic component and the second electronic component, and
  where, in the anisotropic conductive film, γ represents an angle formed between an arrangement axis having a smallest arrangement pitch or a second smallest arrangement pitch of the conductive particles and a short-side direction of the anisotropic conductive film, and $\alpha_{max}$ represents a maximum value of an angle formed between a center axis extending in a long-side direction of each terminal and a short-side direction of the terminal pattern, the anisotropic conductive film has an arrangement axis satisfying $\gamma > \alpha_{max}$.

2. A method for producing a connection structure in which a first electronic component having a terminal pattern in which a plurality of terminals are arranged side by side in a radial form and a second electronic component having a terminal pattern corresponding to the terminal pattern of the first electronic component are anisotropically conductively connected using an anisotropic conductive film, wherein the anisotropic conductive film has a multiple circular region in which conductive particles are disposed on a plurality of concentric circles in an insulating resin layer in a plan view, and where a first line is defined as a line connecting between a first conductive particle on a first concentric circle and a center of the circles, and a second line is defined as a line connecting between a second conductive particle, which is the nearest to the first conductive particle, on a second concentric circle adjacent to the first concentric circle and the center of the circles, the conductive particles are disposed such that the first line and the second line do not coincide with each other, the positions of the conductive particles in the film are aligned in a film thickness direction, and the maximum length Lx of the multiple circular region in a film long-side direction of the anisotropic conductive film is set to be equal to or more than an integral submultiple of the width of the terminal pattern of the first and second electronic component constituting the connection structure.

3. The method for producing a connection structure according to claim 2, wherein, in the anisotropic conductive film, the conductive particles are disposed at predetermined intervals on the plurality of concentric circles in the insulating resin layer in a plan view, and when the first line is defined as the line connecting between the first conductive particle on the first concentric circle and the center of the circles, the second line is defined as the line connecting between the second conductive particle, which is the nearest to the first conductive particle, on the second concentric circle adjacent to the first concentric circle and the center of the circles, and a third line is defined as a line connecting between a third conductive particle, which is the nearest to the second conductive particle, on a third concentric circle adjacent to the second concentric circle and the center of the circles, an angle formed between the second line and the first line is equal to an angle formed between the third line and the second line.

4. The method for producing a connection structure according to claim 2, wherein a plurality of the multiple circular regions are disposed such that each circular region abuts each adjacent circular region with no spacing between the adjacent regions in the anisotropic conductive film.

5. An anisotropic conductive film in which conductive particles are arranged in a lattice form, the anisotropic conductive film being used for anisotropically conductively connecting a first electronic component having a terminal pattern in which a plurality of terminals are arranged side by side in a radial form and a second electronic component having a terminal pattern corresponding to the terminal pattern of the first electronic component, wherein where, in the anisotropic conductive film, $\gamma$ represents an angle formed between an arrangement axis having a smallest arrangement pitch or a second smallest arrangement pitch of the conductive particles and a short-side direction of the anisotropic conductive film, and $\alpha_{max}$ represents a maximum value of an angle formed between a center axis extending in a long-side direction of each terminal constituting the terminal pattern and a short-side direction of the terminal pattern, the anisotropic conductive film has an arrangement axis satisfying $\gamma > \alpha_{max}$.

6. The anisotropic conductive film according to claim 5, wherein a lattice form arrangement of the conductive particles is a hexagonal lattice or a square lattice.

7. A connection structure wherein a first electronic component and a second electronic component are connected using the anisotropic conductive film according to claim 5.

8. A method for producing a connection structure, comprising connecting a first electronic component and a second electronic component by use of the anisotropic conductive film according to claim 5.

9. The anisotropic conductive film according to claim 5, wherein the conductive particles are arranged in an insulating resin layer, and a second insulating resin layer is provided on the insulating resin layer.

10. The anisotropic conductive film according to claim 9, wherein a third insulating resin layer is provided on the opposite side to the insulating resin layer with the second insulating resin layer.

11. The anisotropic conductive film according to claim 5, wherein the conductive particles are metal particles, alloy particles, or metal-coated resin particles on the surface of which insulating fine particles adhere.

12. The anisotropic conductive film according to claim 5, wherein as the conductive particles two or more types of particles are used in combination.

13. An anisotropic conductive film in which conductive particles are disposed in an insulating resin layer, wherein the anisotropic conductive film has a multiple circular region in which the conductive particles are disposed on a plurality of concentric circles in the insulating resin layer in a plan view, and a first line is defined as a line connecting between a first conductive particle on a first concentric circle and a center of the circles, and a second line is defined as a line connecting between a second conductive particle, which is the nearest to the first conductive particle, on a second concentric circle adjacent to the first concentric circle and the center of the circles, the conductive particles are disposed such that the first line and the second line do not coincide with each other, the positions of the conductive particles in the film are aligned in a film thickness direction, and the maximum length Lx of the multiple circular region in a film long-side direction of the anisotropic conductive film is set to be equal to or more than an integral submultiple of the width of the terminal pattern of the first and second electronic component constituting the connection structure.

14. The anisotropic conductive film according to claim 13, wherein the conductive particles are disposed at predetermined intervals on the plurality of concentric circles in the insulating resin layer in a plan view, and the first line is defined as the line connecting between the first conductive particle on the first concentric circle and the center of the circles, the second line is defined as the line connecting between the second conductive particle, which is the nearest to the first conductive particle, on the second concentric circle adjacent to the first concentric circle and the center of the circles, and a third line is defined as a line connecting between a third conductive particle, which is the nearest to the second conductive particle, on a third concentric circle adjacent to the second concentric circle and the center of the circles, an angle formed between the second line and the first line is equal to an angle formed between the third line and the second line.

15. The anisotropic conductive film according to claim 13, wherein a plurality of the multiple circular regions are disposed such that each circular region abuts each adjacent circular region with no spacing between the adjacent regions.

16. An anisotropic conductive film which is a band-shaped anisotropic conductive film obtained by cutting the anisotropic conductive film according to claim 13 into long band shapes, the anisotropic conductive film having a curved conductive particle arrangement.

* * * * *